(12) United States Patent
Sudo

(10) Patent No.: US 7,529,315 B2
(45) Date of Patent: May 5, 2009

(54) MULTI-CARRIER TRANSMITTING APPARATUS AND MULTI-CARRIER TRANSMITTING METHOD

(75) Inventor: Hiroaki Sudo, Yokohama (JP)

(73) Assignee: Panasonic Corporation, Osaka (JP)

( * ) Notice: Subject to any disclaimer, the term of this patent is extended or adjusted under 35 U.S.C. 154(b) by 855 days.

(21) Appl. No.: 10/530,368

(22) PCT Filed: Oct. 1, 2003

(86) PCT No.: PCT/JP03/12564

§ 371 (c)(1),
(2), (4) Date: Apr. 6, 2005

(87) PCT Pub. No.: WO2004/034620

PCT Pub. Date: Apr. 22, 2004

(65) Prior Publication Data

US 2006/0160498 A1     Jul. 20, 2006

(30) Foreign Application Priority Data

Oct. 10, 2002   (JP) ............................ 2002-297534
Jan. 15, 2003   (JP) ............................ 2003-007616

(51) Int. Cl.
*H04L 27/00* (2006.01)
(52) U.S. Cl. ...................................... 375/295; 375/316
(58) Field of Classification Search ................. 375/295, 375/316
See application file for complete search history.

(56) References Cited

U.S. PATENT DOCUMENTS 5,371,548 A    12/1994   Williams
5,504,775 A    4/1996    Chouly et al.
6,950,474 B1 *  9/2005   Sudo ........................... 375/260

(Continued)

FOREIGN PATENT DOCUMENTS

EP          1124344          8/2001

(Continued)

OTHER PUBLICATIONS

Zhang, "Turbo coding for transmission over ADSL", WCC—ICCT 2000, International Conference on Communication Technology Proceedings, 2000, —ICCT vol. 1, on pp. 124-131 vol. 1, Meeting Date: Aug. 21, 2000-Aug. 25, 2000.*

(Continued)

*Primary Examiner*—Juan A Torres
(74) *Attorney, Agent, or Firm*—Dickinson Wright, PLLC

(57) ABSTRACT

A multicarrier transmitting apparatus includes a dividing section that divides transmit data into high-quality transmit data requiring good quality and ordinary transmit data other than the high-quality transmit data. A subcarrier allocation section rearranges the high-quality transmit data and the ordinary transmit data such that the high-quality transmit data is allocated to subcarriers in the vicinity of a center frequency in a predetermined frequency domain and the ordinary transmit data is allocated to subcarriers in the vicinity of both ends in the predetermined frequency domain. The subcarrier allocation section varies, in accordance with channel quality, a range of subcarrier to which the high-quality transmit data and ordinary transmit data are allocated. An orthogonal frequency division multiplexing section performs orthogonal frequency division multiplexing of the high-quality transmit data and the ordinary transmit data rearranged by said subcarrier allocating section.

9 Claims, 21 Drawing Sheets

U.S. PATENT DOCUMENTS

| | | | |
|---|---|---|---|
| 7,190,730 B2 * | 3/2007 | Ehrmann | 375/260 |
| 2001/0012322 A1 | 8/2001 | Nagaoka et al. | |
| 2001/0024427 A1 | 9/2001 | Suzuki | |
| 2001/0040913 A1 | 11/2001 | Arai et al. | |
| 2002/0003787 A1 | 1/2002 | Hayama et al. | |
| 2002/0126763 A1 | 9/2002 | Jeong et al. | |
| 2002/0159426 A1 | 10/2002 | Kanemoto et al. | |
| 2002/0163975 A1 | 11/2002 | Uesugi et al. | |
| 2002/0181557 A1 | 12/2002 | Fuji | |
| 2003/0014709 A1 | 1/2003 | Miyoshi et al. | |
| 2003/0060173 A1 * | 3/2003 | Lee et al. | 455/103 |

FOREIGN PATENT DOCUMENTS

| | | | | |
|---|---|---|---|---|
| JP | 10126381 | | | 5/1998 |
| JP | 2000269918 | | | 9/2000 |
| JP | 2000269918 | A | * | 9/2000 |
| JP | 2001060934 | | | 3/2001 |
| JP | 2001060934 | A | * | 3/2001 |
| JP | 2001156744 | | | 6/2001 |
| JP | 2001156744 | A | * | 6/2001 |
| JP | 2001168821 | | | 6/2001 |
| JP | 2001168821 | A | * | 6/2001 |
| JP | 2001203664 | | | 7/2001 |
| JP | 2001203664 | A | * | 7/2001 |
| JP | 2001223665 | | | 8/2001 |
| JP | 2001238269 | | | 8/2001 |
| JP | 2001274767 | | | 10/2001 |
| JP | 2002044048 | | | 2/2002 |
| JP | 2002044048 | A | * | 2/2002 |
| JP | 2002094393 | | | 3/2002 |
| JP | 2002094393 | A | * | 3/2002 |
| JP | 2002095065 | | | 3/2002 |
| JP | 2002111542 | | | 4/2002 |
| JP | 2002111631 | | | 4/2002 |
| JP | 2002111631 | A | * | 4/2002 |
| JP | 2002164948 | | | 6/2002 |
| JP | 2002171298 | | | 6/2002 |
| JP | 2002198938 | | | 7/2002 |
| JP | 2002217748 | | | 8/2002 |

OTHER PUBLICATIONS

Zhang, "Turbo coding in ADSL DMT systems" ICC 2001, IEEE International Conference on Communications, 2001. Publication Date: Jun. 11-14, 2001 vol. 1, on pp. 151-155 vol. 1. Meeting Date: Jun. 11, 2001-Jun. 14, 2001.*

PCT International Search Report dated Jan. 20, 2004.

* cited by examiner

MULTI-CARRIER TRANSMITTING APPARATUS AND MULTI-CARRIER TRANSMITTING METHOD

TECHNICAL FIELD

The present invention relates to a multicarrier transmitting apparatus and multicarrier transmitting method.

BACKGROUND ART

Error correction coding methods include turbo coding, which has been adopted as standard in 3GPP. A feature of this turbo coding is that extremely good error rate characteristics can be obtained compared with other error correction methods.

Orthogonal Frequency Division Multiplexing (OFDM) is an effective communication method for the fourth generation, and is regarded as important as a fourth-generation communication method. On the other hand, since OFDM communication ceases to be possible at all in the presence of interference, the OFDM-CDMA communication method is known that combines CDMA and OFDM and enables communication to be performed even when interference from another cell is present by reducing interference from other cells by means of despreading processing.

Error rate characteristics can be improved by using a combination of turbo coding and the OFDM communication method, or a combination of turbo coding and the OFDM-CDMA communication method, in this way.

However, a problem with a conventional multicarrier transmitting apparatus and multicarrier transmitting method is that, although error rate characteristics can be improved to some extent by combining turbo coding and the OFDM communication method, or turbo coding and the OFDM-CDMA communication method, when simultaneous transmission is performed using a plurality of channels, mutual interference occurs between transmit signals of different channels, and there is a limit to the improvement in error rate characteristics.

DISCLOSURE OF INVENTION

It is an object of the present invention to provide a multicarrier transmitting apparatus and multicarrier transmitting method that make it possible to improve significantly the error rate characteristics of transmit data for which good quality is required, and prevent degradation of the quality of transmit data for which good quality is required.

This object can be achieved by allocating transmit data for which good quality is required, such as systematic bits, to subcarriers in the vicinity of the center frequency.

BEST MODE FOR CARRYING OUT THE INVENTION

With reference now to the accompanying drawings, embodiments of the present invention will be explained in detail below.

Embodiment 1

Figure 1:
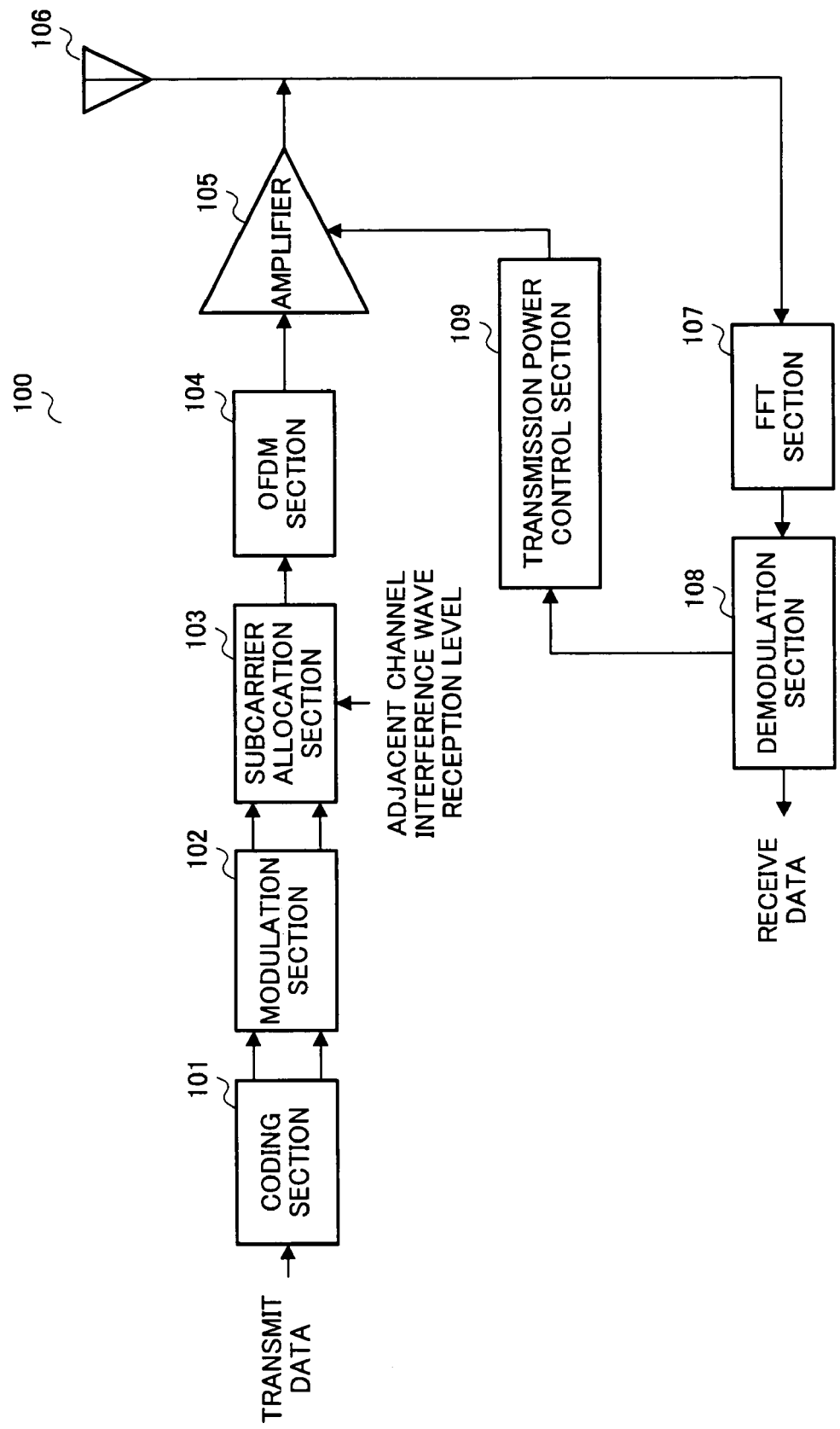
FIG. 1 is a block diagram showing the configuration of a multicarrier transmitting apparatus according to Embodiment 1 of the present invention.
Figure 2:
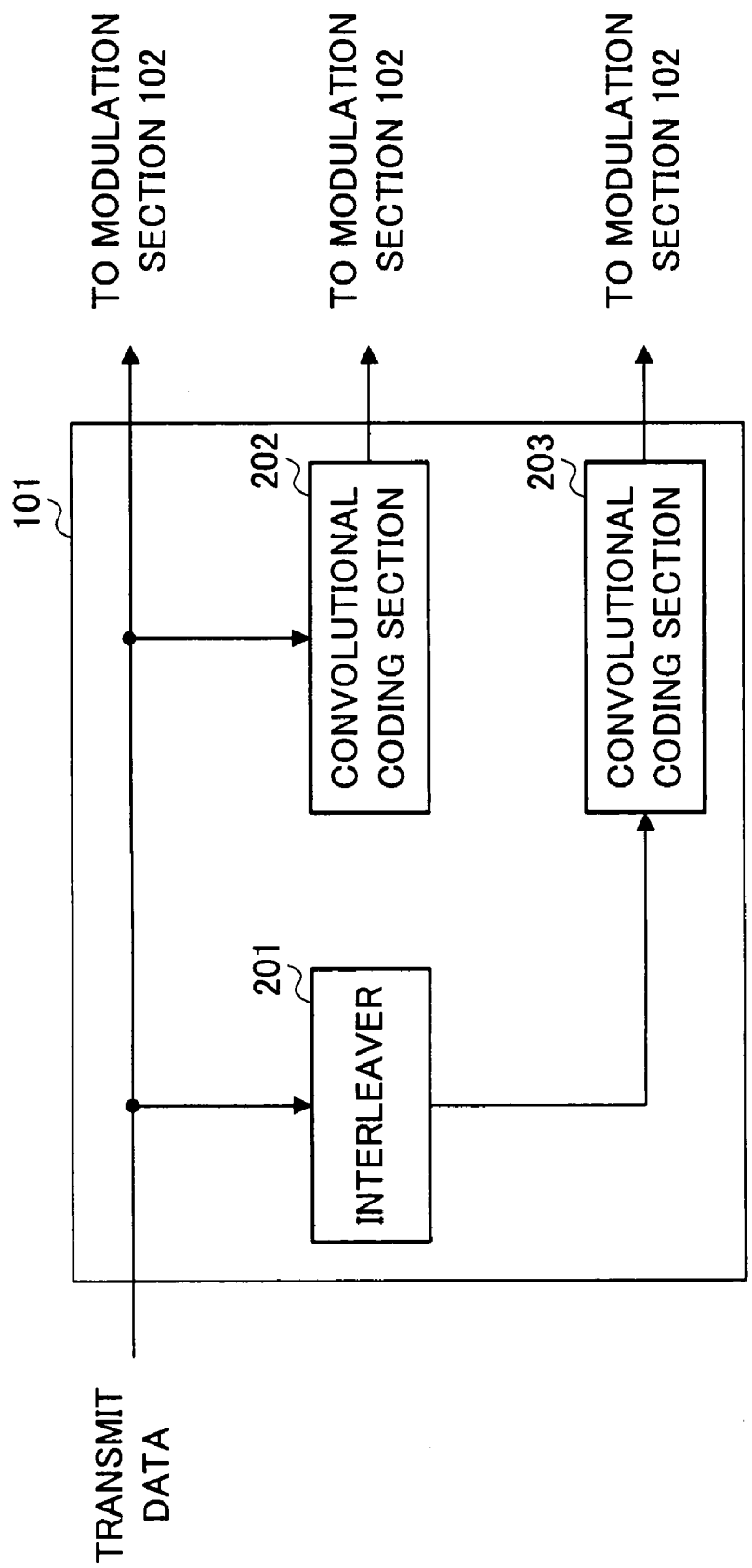
FIG. 2 is a block diagram showing the configuration of a coding section according to Embodiment 1 of the present invention.
Figure 3:
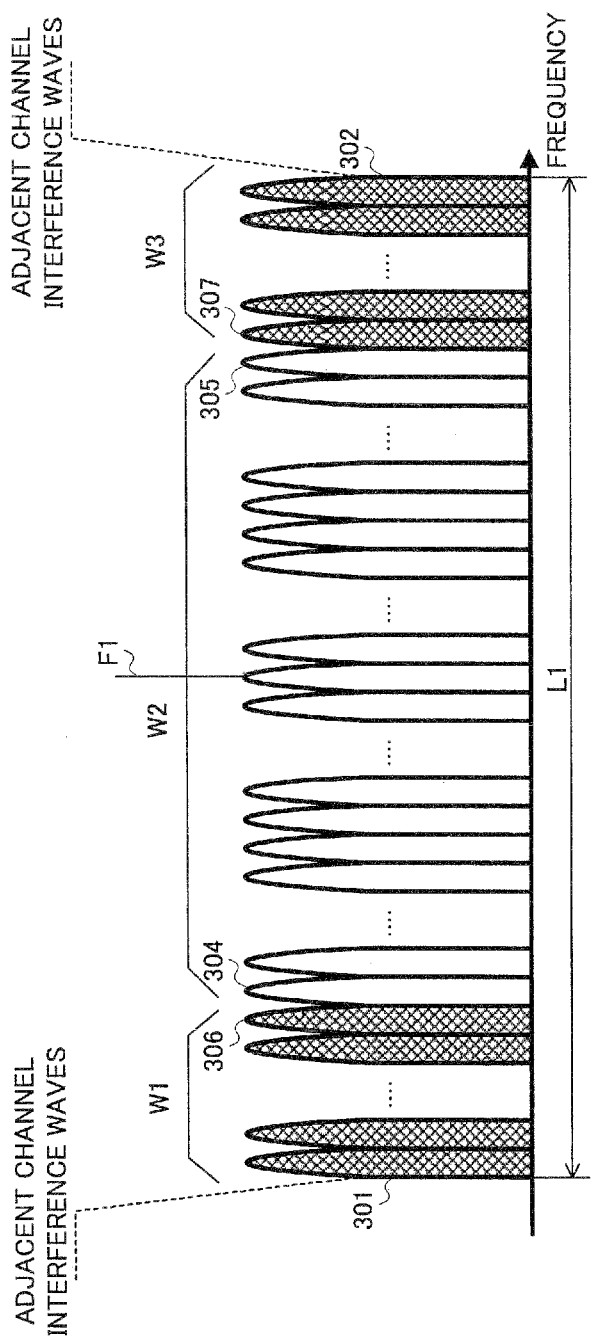
FIG. 3 is a drawing showing data allocation for each subcarrier.

FIG. 1 is a drawing showing the configuration of a multicarrier transmitting apparatus 100 according to this embodiment, FIG. 2 is a drawing showing the configuration of a coding section 101, and FIG. 3 is a drawing showing transmit data allocation for each subcarrier.

Multicarrier transmitting apparatus 100 is mainly composed of coding section 101, a modulation section 102, a subcarrier allocation section 103, an OFDM section 104, an amplifier 105, an antenna 106, an FFT section 107, a demodulation section 108, and a transmission power control section 109.

Coding section 101, which is a dividing section, may be a turbo coder, for example, and outputs part of the input transmit data uncoded to modulation section 102 as systematic bit data, performs recursive convolutional coding on the remaining part of the input transmit data, and outputs this to modulation section 102 as parity bit data. Coding section 101 will be described in detail later herein.

Modulation section 102 executes respective modulation processing on the systematic bit data, which is high-quality transmit data, and parity bit data, which is ordinary transmit data, input from coding section 101, and outputs the modulated systematic bit data and parity bit data to subcarrier allocation section 103. The modulation method used in modulation section 102 is changed adaptively according to the channel quality, with either 16QAM or QPSK being used. Then both systematic bit data and parity bit data are modulated by means of the same modulation method. The modulation method is not limited to 16QAM or QPSK, and a modulation method other than 16QAM or QPSK may be used.

Subcarrier allocation section 103, which is a rearranging section, performs rearrangement of systematic bit data and parity bit data so that, within the subcarrier frequency range in which transmit data is allocated, systematic bit data input from modulation section 102 is allocated to subcarriers in the vicinity of the center frequency, and parity bit data is allocated to subcarriers in the vicinity of each end. The ranges on the subcarrier frequency axis to which systematic bit data and parity bit data are allocated are changed in accordance with an adjacent channel interference wave reception level input to subcarrier allocation section 103. That is to say, when the adjacent channel interference wave reception level is high, transmit data rearrangement is performed so that systematic bit data is allocated to subcarriers in-a narrow frequency range including center frequency F1, and when the adjacent channel interference wave reception level is low, transmit data rearrangement is performed so that systematic bit data is allocated to subcarriers in a wide frequency range including center frequency F1. Then subcarrier allocation section 103 outputs transmit data composed of the rearranged systematic bit data and parity bit data to OFDM section 104.

OFDM section 104, which is an orthogonal frequency division multiplexing section, performs orthogonal frequency division multiplexing and generates an OFDM signal by executing serial-parallel conversion processing, followed by inverse fast Fourier transform (IFFT) processing, on the transmit data input from subcarrier allocation section 103, and transmits the generated OFDM signal from antenna 106 via amplifier 105. The method of allocating transmit data for each subcarrier will be described in detail later herein.

Amplifier 105 transmits transmit data input from OFDM section 104 from antenna 106 at predetermined transmission power controlled by transmission power control section 109. At this time, systematic bit data allocated to subcarriers in the vicinity of the center frequency is transmitted at transmission power greater than the transmission power of parity bit data allocated to subcarriers in the vicinity of both ends.

FFT section 107 executes fast Fourier transform (FFT) processing on receive data received by antenna 106, and outputs the resulting data to demodulation section 108.

Demodulation section 108 obtains receive data by demodulating the receive data input from FFT section 107, and outputs the demodulated receive data to transmission power control section 109.

Transmission power control section 109, which is a transmission power setting section, determines transmission power from the receive data input from demodulation section 108, and performs transmission power control for amplifier 105 so that transmit data is transmitted at the determined transmission power. Transmission power control section 109 performs transmission power control so that the transmission power of systematic bit data allocated to subcarriers in the vicinity of the center frequency is greater than the transmission power of parity bit data allocated to subcarriers of the frequencies at both ends. By this means, transmission power can be varied according to channel quality. Therefore, transmit data is transmitted at transmission power that is based on channel quality.

Next, the configuration of coding section 101 will be described in detail using FIG. 2. Coding section 101 is mainly composed of an interleaver 201, a convolutional coding section 202, and a convolutional coding section 203.

Interleaver 201 performs interleaving, which is rearrangement processing, of transmit data, and outputs the resulting data to convolutional coding section 203.

Convolutional coding section 202 performs recursive convolutional coding of part of the transmit data, and outputs the resulting data to modulation section 102. The output from convolutional coding section 202 is parity bit data.

Convolutional coding section 203 performs recursive convolutional coding of part of the transmit data input from interleaver 201, and outputs the resulting data to modulation section 102. The output from convolutional coding section 203 is parity bit data. Also, part of the transmit data input to coding section 101 is output directly without being coded. This output is systematic bit data.

Transmit data allocation for each subcarrier will now be described using FIG. 3. In FIG. 3, subcarriers are arranged on the frequency axis, and subcarriers are allocated to the same frequency width to the left and right of center frequency F1. Reference code L1 in FIG. 3 indicates the subcarrier frequency range to which transmit data composed of systematic bit data and parity bit data is allocated. Subcarriers 301 and 302 are the end subcarriers. The subcarriers from subcarrier 304 to subcarrier 305 are subcarriers in the vicinity of the center frequency. The subcarriers from subcarrier 301 to subcarrier 306 and from subcarrier 302 to subcarrier 307 are subcarriers in the vicinity of the ends.

Adjacent channel interference waves are present at frequencies lower than subcarrier 301 (on the left in FIG. 3) and frequencies higher than subcarrier 302 (on the right in FIG. 3). Therefore, the effect of adjacent channel interference waves gradually increases from center frequency F1 toward subcarriers 301 and 302, and consequently error rate characteristics gradually degrade from center frequency F1 toward subcarriers 301 and 302.

After transmit data has undergone frequency division multiplexing processing by OFDM section 104, parity bit data is allocated to subcarriers in frequency ranges W1 and W3, and systematic bit data is allocated to subcarriers in frequency range W2. Subcarrier frequency range W2 to which systematic bit data is allocated is changed according to the adjacent channel interference wave reception level. That is to say, when the adjacent channel interference wave reception level is high, frequency range W2 to which systematic bit data is allocated is made narrower, and when the adjacent channel interference wave reception level is low, frequency range W2 to which systematic bit data is allocated is made wider.

Another example will now be described in which transmit data is other than systematic bit data and parity bit data. As another example in which transmit data is other than systematic bit data and parity bit data, this embodiment can also be applied to a case where transmit data for which good quality is required, such as control information or retransmission information, and transmit data other than control information or retransmission information, for which normal quality is sufficient, are allocated to respective subcarriers. In this case, coding section 101 need not necessarily be a turbo coder, and a coder other than a turbo coder can be used. Control information is information used for communication control, and retransmission information is information for having data transmitted again when data cannot be demodulated correctly due to the occurrence of an error on the receiving side. Coding section 101 divides transmit data into transmit data for which good quality is required and transmit data for which normal quality is sufficient, and outputs these transmit data to subcarrier allocation section 103.

Subcarrier allocation section 103 rearranges the transmit data so that transmit data for which good quality is required is allocated to subcarriers in the vicinity of center frequency F1, and transmit data for which normal quality is sufficient is allocated to subcarriers in the vicinity of both ends.

After transmit data has undergone frequency division multiplexing processing by OFDM section 104, transmit data for which good quality is required is allocated to subcarriers in frequency range W2 in the vicinity of center frequency F1, and transmit data for which normal quality is sufficient is allocated to subcarriers in frequency ranges W1 and W3 in the vicinity of both ends.

Thus, according to a multicarrier transmitting apparatus and multicarrier transmitting method of this embodiment, systematic bit data is allocated to subcarriers in the vicinity of the center frequency, and parity bit data is allocated to subcarriers in the vicinity of both ends, making it possible to improve the error rate characteristics of transmit data for which good quality is required, and to improve the communication quality of transmit data for which good quality is required. Also, transmit data for which good quality is required, such as control information or retransmission information, is allocated to subcarriers in the vicinity of the center frequency, and transmit data other than control information or retransmission information, for which normal quality is sufficient, is allocated to subcarriers in the vicinity of both ends, making it possible to improve the error rate characteristics of transmit data for which good quality is required, and to improve the communication quality of transmit data for which good quality is required, such as control information or retransmission information. Furthermore, transmission power control is performed so that the transmission power of systematic bit data allocated to subcarriers in the vicinity of the center frequency is greater than the transmission power of parity bit data allocated to subcarriers of frequencies at both ends, enabling the error rate characteristics of systematic bit data to be improved.

In this embodiment, it has been assumed that transmission power control related to channel quality is performed using demodulation results, but this is not a limitation, and transmission power may also be set variably independently of demodulation results. In this embodiment, also, it has been assumed that both the transmission power of systematic bit data and the transmission power of parity bit data are made variable, but this is not a limitation, and the transmission power of only systematic bit data or only parity bit data may be made variable. Furthermore, in this embodiment the transmission power of systematic bit data is made greater than the transmission power of parity bit data, but this is not a limitation, and the transmission power of systematic bit data and the transmission power of parity bit data may be made the same, or the transmission power of parity bit data may be made greater than the transmission power of systematic bit data. Moreover, transmit data is not limited to systematic bit data and parity bit data, and may be data other than systematic bit data and parity bit data for which the required quality differs. In this case, a coder other than a turbo coder can be used for coding section 101.

Embodiment 2

Figure 4:
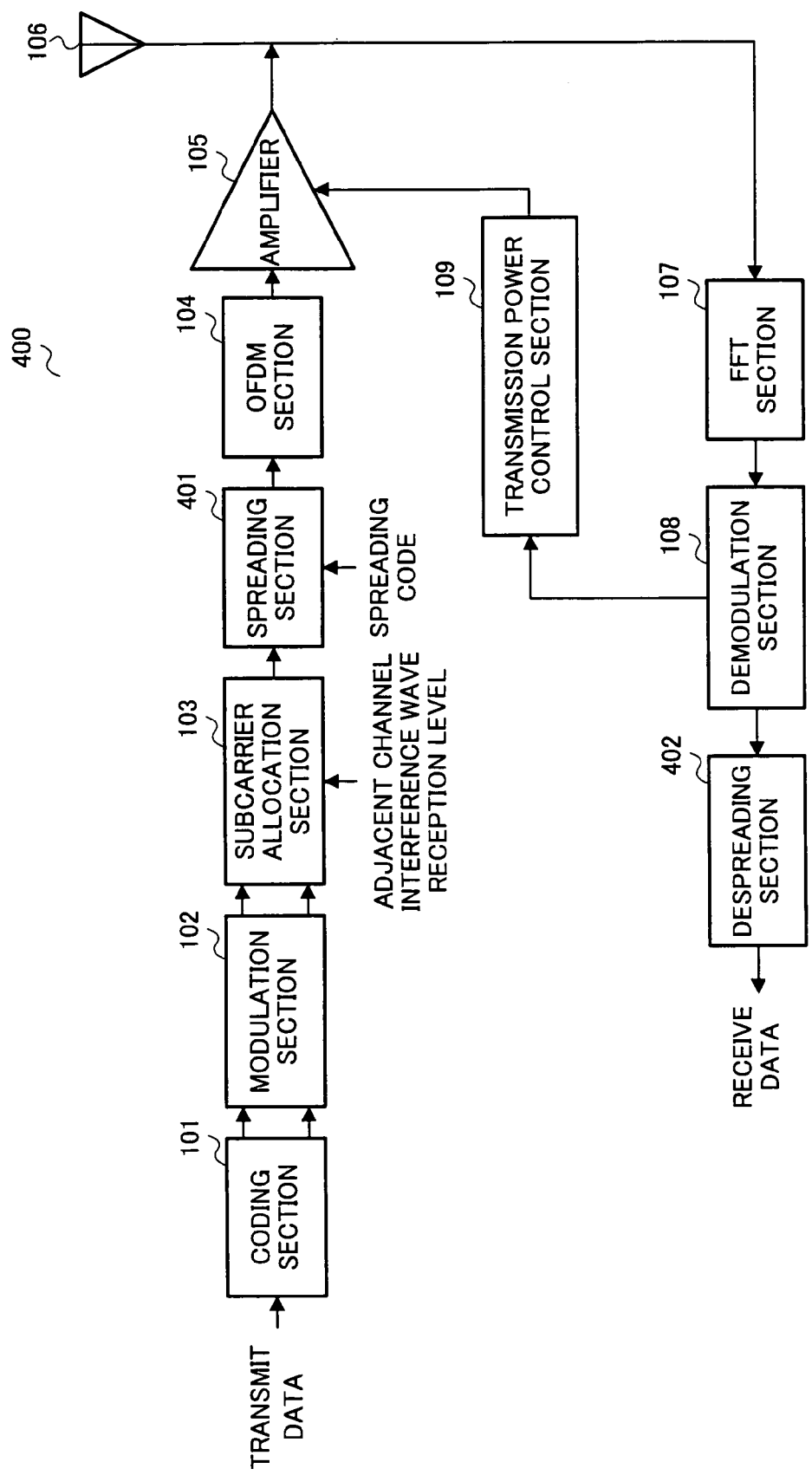
FIG. 4 is a block diagram showing the configuration of a multicarrier transmitting apparatus according to Embodiment 2 of the present invention.
Figure 5:
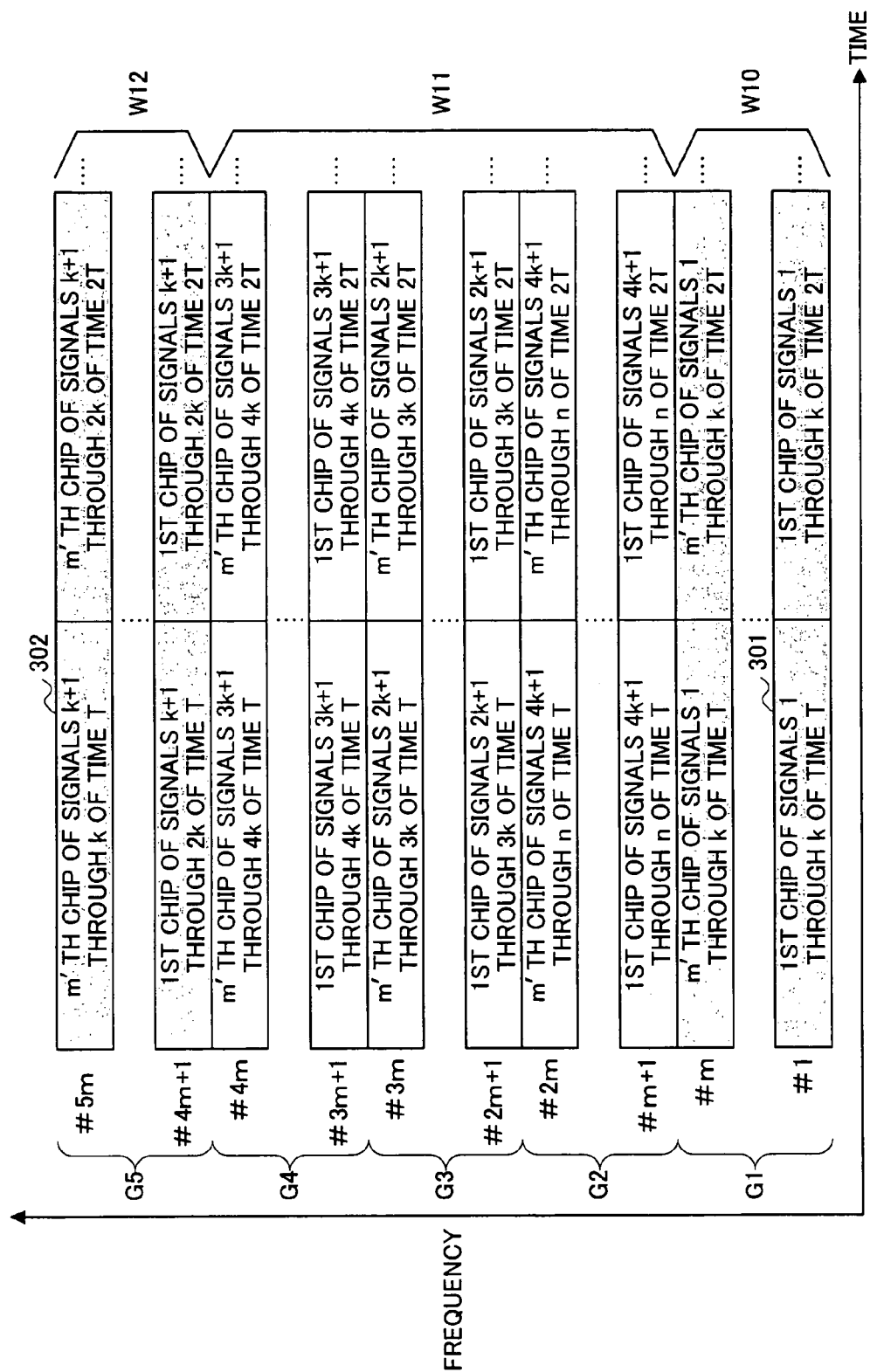
FIG. 5 is a schematic diagram showing data allocation for each subcarrier.
Figure 6:
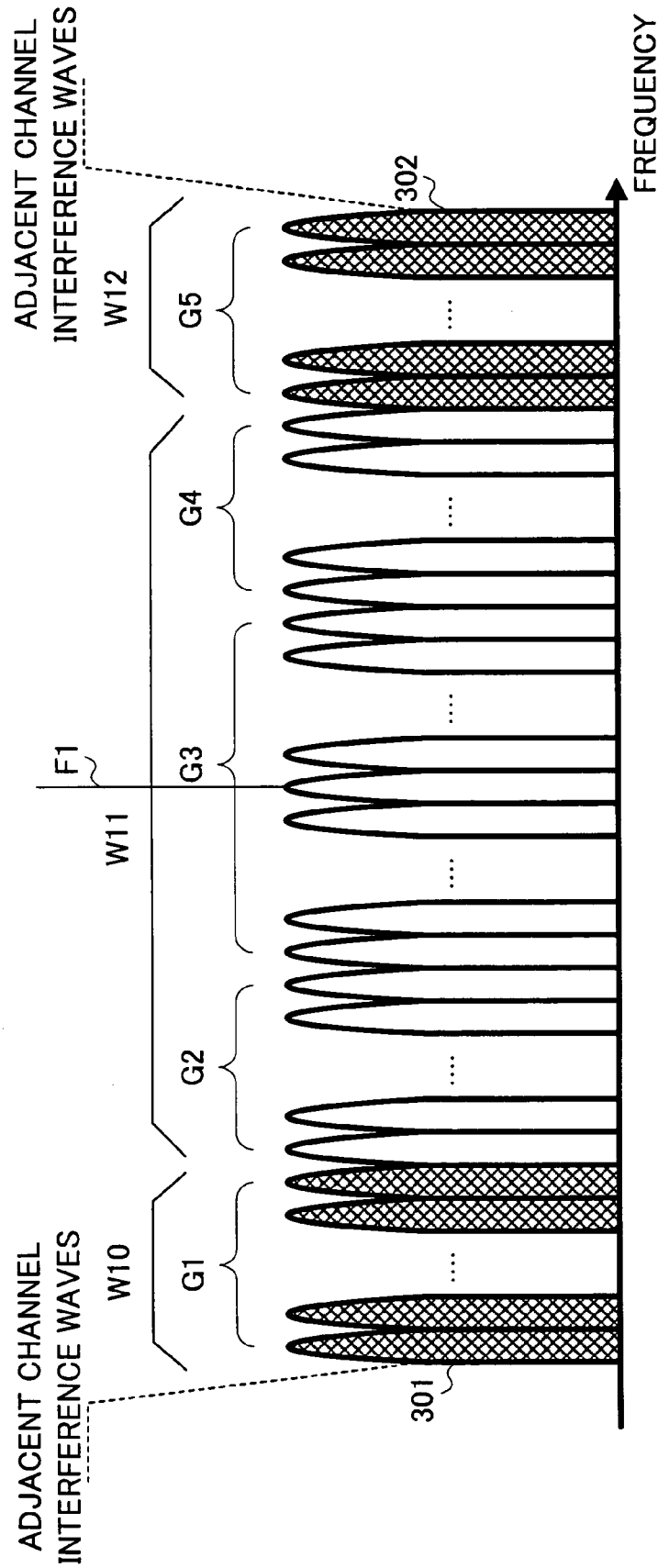
FIG. 6 is a drawing showing data allocation for each subcarrier.

FIG. 4 is a drawing showing the configuration of a multicarrier transmitting apparatus 400 according to Embodiment 2 of the present invention, and FIG. 5 and FIG. 6 are drawings showing data allocation for each subcarrier. This embodiment uses a communication method combining CDMA and multicarrier communication.

A communication method effective for the fourth generation is the OFDM-CDMA communication method combining CDMA and OFDM. The OFDM-CDMA communication method enables interference from other cells to be reduced by means of despreading processing, making it possible for communication to be carried out even when interference from another cell is present, and in this respect differs greatly from OFDM, with which communication becomes totally impossible in the presence of interference waves. In this embodiment, the configuration in FIG. 4 differs from that in FIG. 1 in the provision of a spreading section 401 and despreading section 402. Other component parts in FIG. 4 are identical to those in FIG. 1 and are assigned the same codes as in FIG. 1, and descriptions thereof are omitted.

In the OFDM-CDMA communication method, there is a method whereby subcarriers are divided into a plurality of groups, and users are assigned to respective subcarrier groups.

Spreading section 401 performs spreading processing of transmit data input from subcarrier allocation section 103 so that the spreading ratio is ⅕ the number of carriers, and outputs the resulting transmit data to OFDM section 104.

OFDM section 104 performs orthogonal frequency division multiplexing and generates an OFDM signal by executing serial-parallel conversion processing, followed by inverse fast Fourier transform processing and parallel-serial conversion processing, on the spread transmit data input from spreading section 401, and then distributing spread chips to a plurality of subcarriers that are in a mutually orthogonal relationship, and transmits the generated OFDM signal from antenna 106 via amplifier 105.

Despreading section 402 obtains receive data by executing despreading processing on receive data input from demodulation section 108, and outputs the receive data that has undergone despreading processing to transmission power control section 109.

Transmission power control section 109 determines transmission power from the receive data input from despreading section 402, and performs transmission power control for amplifier 105 so that transmit data is transmitted at the determined transmission power. Transmission power control section 109 performs transmission power control so that the transmission power of systematic bit data allocated to subcarriers in the vicinity of the center frequency is greater than the transmission power of parity bit data allocated to subcarriers of the frequencies at both ends.

When spreading processing and multiplexing are performed, the spreading ratio, code multiplexing number, and number of spreading codes are made the same for all subcarriers or all users. Here, the number of spreading codes is the number of spreading codes assigned to one user. The code multiplexing number is the multiplexing number per carrier, and is determined by the number of users (number of codes) multiplexed.

FIG. 5 is a drawing showing the situation when code division multiplex signals divided into five groups are allocated to subcarriers, and FIG. 6 is a drawing showing grouped subcarrier allocation as in FIG. 5, by means of the same kind of method as in FIG. 3. Group 1 (G1) is composed of subcarriers #1 through #m, group 2 (G2) is composed of subcarriers #m+1 through #2m, group 3 (G3) is composed of subcarriers #2m+1 through #3m, group 4 (G4) is composed of subcarriers #3m+1 through #4m, and group 5 (G5) is composed of subcarriers #4m+1 through #5m. Frequency range W10 includes group 1 subcarriers, frequency range W11 includes group 2, 3, and 4 subcarriers, and frequency range W12 includes group 5 subcarriers.

In general, the effect of adjacent channel interference waves is greatest for group 1 and 5 subcarriers, next greatest for group 2 and 4 subcarriers, and least for group 3 subcarriers. Therefore, parity bit data for which normal quality is sufficient is allocated to group 1 and 5 subcarriers, and systematic bit data for which good quality is required is allocated to group 2, 3, and 4 subcarriers.

Next, examples will be described other than the case where the spreading ratio, code multiplexing number, and number of spreading codes are made the same for all subcarriers or all users when performing spreading processing and multiplexing, as described above. The following methods can be applied as examples other than the case where the spreading ratio, code multiplexing number, and number of spreading codes are made the same for all subcarriers or all users.

First, a case will be described in which the spreading ratio is varied according to the transmit data. It is possible for spreading section 401 to select any spreading ratio. It is also possible for spreading section 401 to select the spreading ratios for systematic bit data and parity bit data independently, and perform spreading processing of systematic bit data and parity bit data independently using the selected spreading ratios. When the spreading ratio is made larger, the spread chip tap length for one symbol is increased, enabling despreading precision to be improved, and transmit data to be restored with a high degree of precision on the receiving side.

Therefore, based on FIG. 5 and FIG. 6, the spreading ratio of systematic bit data allocated to groups 2, 3, and 4 comprising subcarriers in the vicinity of the center frequency is made greater than the spreading ratio of parity bit data allocated to groups 1 and 5 comprising subcarriers of the frequencies at both ends. This embodiment is not limited to the case where the spreading ratio of systematic bit data is made greater than the spreading ratio of parity bit data, and the spreading ratio of parity bit data may be made greater than the spreading ratio of systematic bit data.

Next, a case will be described in which the code multiplexing number is varied according to the transmit data. It is possible for OFDM section 104 to select any code multiplexing number. It is also possible for OFDM section 104 to select the code multiplexing numbers for systematic bit data and parity bit data independently, and perform code multiplexing of systematic bit data and parity bit data independently using the selected code multiplexing numbers. A subcarrier for which the code multiplexing number is made small has lower transmission power than other subcarriers. It is therefore possible to further increase the transmission power, and to further improve error rate characteristics when there are adjacent channel interference waves or there is analog filter degradation.

Therefore, based on FIG. 5 and FIG. 6, the code multiplexing number of systematic bit data allocated to groups 2, 3, and 4 comprising subcarriers in the vicinity of the center frequency is made smaller than the code multiplexing number of parity bit data allocated to groups 1 and 5 comprising subcarriers of the frequencies at both ends. This embodiment is not limited to the case where the code multiplexing number of systematic bit data is made smaller than the code multiplexing number of parity bit data, and the code multiplexing number of parity bit data may be made smaller than the code multiplexing number of systematic bit data.

Next, a case will be described in which the assigned number of spreading codes is varied according to the transmit data. It is possible for spreading section 401 to select any number of spreading codes. It is also possible for spreading section 401 to select the assigned number of spreading codes for systematic bit data and parity bit data independently, and perform spreading processing of systematic bit data and parity bit data independently using the selected number of spreading codes. In a multipath environment, orthogonality between spreading codes is lost due to delayed waves, but the loss of orthogonality may be great or small depending on the spreading codes. Consequently, multicode transmission enables a diversity effect to be obtained and makes it possible to further improve error rate characteristics.

Therefore, based on FIG. 5 and FIG. 6, the code multiplexing number of systematic bit data allocated to groups 2, 3, and 4 comprising subcarriers in the vicinity of the center frequency is made greater than the code multiplexing number of parity bit data allocated to groups 1 and 5 comprising subcarriers of the frequencies at both ends. This embodiment is not limited to the case where the number of spreading codes assigned to systematic bit data is made greater than the number of spreading codes assigned to parity bit data, and the number of spreading codes assigned to parity bit data may be made greater than the number of spreading codes assigned to systematic bit data.

Here, subcarrier frequency range W11 to which systematic bit data is allocated is changed according to the adjacent channel interference wave reception level. That is to say, when the adjacent channel interference wave reception level is high, frequency range W11 to which systematic bit data is allocated is made narrower, and when the adjacent channel interference wave reception level is low, frequency range W11 to which systematic bit data is allocated is made wider. The subcarriers distributed among groups 1 through 5 are also changed in accordance with changes of frequency range W11.

Thus, according to a multicarrier transmitting apparatus and multicarrier transmitting method of this embodiment, in addition to the provision of the effects of above-described Embodiment 1, transmission is performed by means of an OFDM-CDMA communication method whereby transmit data undergoes spreading processing and orthogonal frequency division multiplexing, enabling error rate characteristics to be improved even when interference from another cell is present without lowering spectral efficiency. Also, when the spreading ratio of systematic bit data is made greater than the spreading ratio of parity bit data, systematic bit data can be restored with a high degree of precision on the receiving side, making it possible to improve the error rate characteristics of systematic bit data for which good quality is required. When the code multiplexing number of systematic bit data is made smaller than the code multiplexing number of parity bit data, it is possible to increase the transmission power of systematic bit data, making it possible to improve the error rate characteristics of systematic bit data for which good quality is required. Furthermore, when the code multiplexing number of systematic bit data is made greater than the code multiplexing number of parity bit data, it is possible to improve the error rate characteristics of systematic bit data for which good quality is required through a diversity effect in the systematic bit data.

In this embodiment, subcarriers are divided into five groups, but subcarriers need not necessarily be divided into five groups, and the number of groups may be other than five. Also, transmit data is not limited to systematic bit data and parity bit data, and may be data other than systematic bit data and parity bit data for which the required quality differs. In this case, a coder other than a turbo coder can be used for coding section 101.

Embodiment 3

Figure 7:
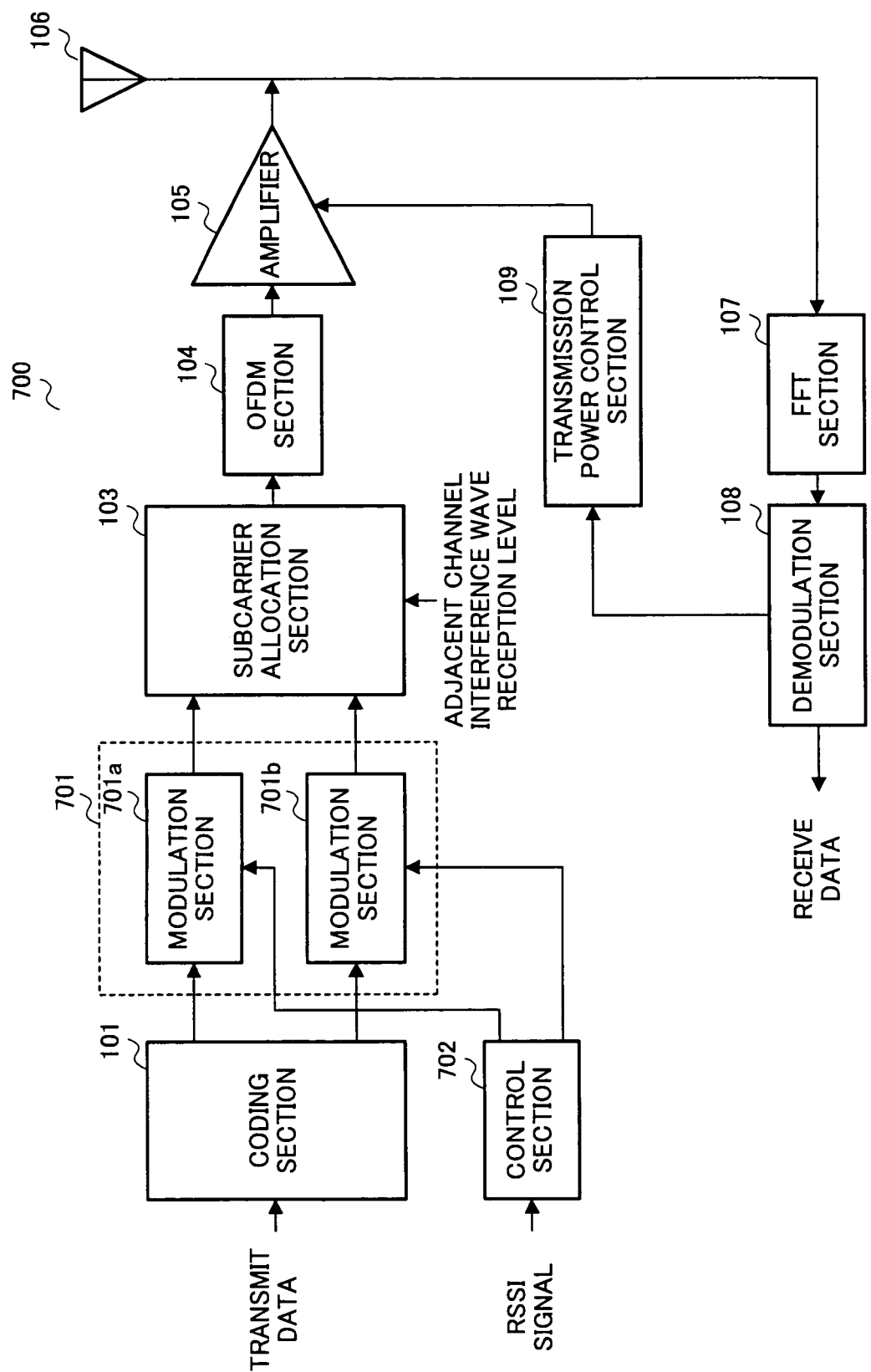
FIG. 7 is a block diagram showing the configuration of a multicarrier transmitting apparatus according to Embodiment 3 of the present invention.
Figure 8:
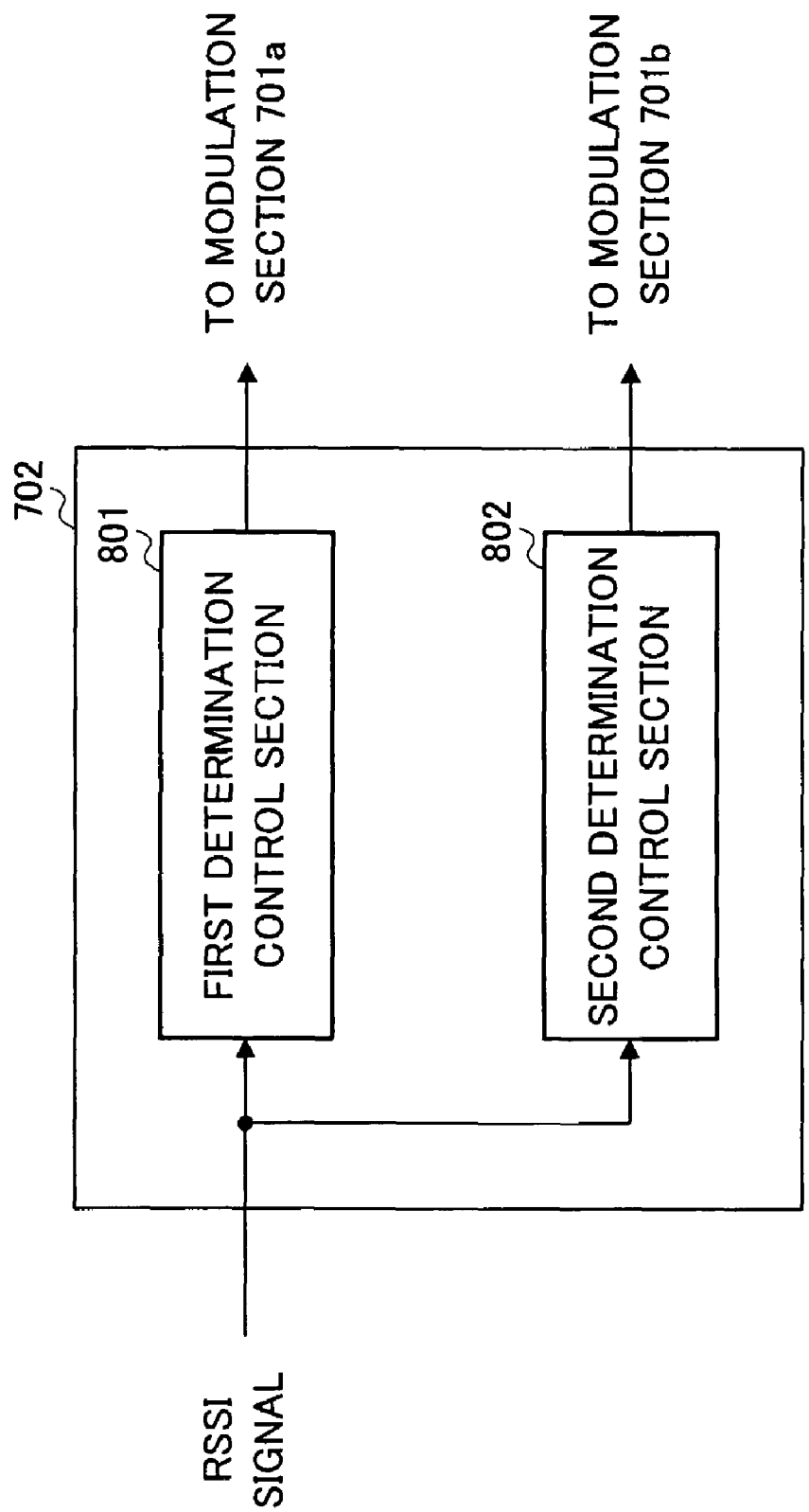
FIG. 8 is a drawing showing the configuration of a control section according to Embodiment 3 of the present invention.

FIG. 7 is a drawing showing the configuration of a multi-carrier transmitting apparatus 700 according to Embodiment 3 of the present invention, and FIG. 8 is a drawing showing the configuration of a control section 702. A feature of this embodiment is that turbo code is used as an error correction code, and systematic bit data and parity bit data are adaptively modulated independently.

In this embodiment, the configuration in FIG. 7 differs from that in FIG. 1 in that a modulation section 701 is composed of a modulation section 701a and modulation section 701b, and control section 702 is provided. Other component parts in FIG. 4 are identical to those in FIG. 1 and are assigned the same codes as in FIG. 1, and descriptions thereof are omitted.

Control section 702 outputs to modulation section 701a and modulation section 701b control signals specifying modulation methods set based on an RSSI (Received Signal Strength Indicator) signal level. When setting modulation methods, control section 702 uses two threshold values: a threshold value α for setting the modulation method when modulating systematic bit data, and a threshold value β for setting the modulation method when modulating parity bit data. If the RSSI signal level is greater than or equal to threshold value α, channel quality is estimated to be good, and a control signal setting the 16QAM modulation method as the systematic bit data modulation method is output to modulation section 701a. If the RSSI signal level is greater than or equal to threshold value β, channel quality is estimated to be good, and a control signal setting the 16QAM modulation method as the parity bit data modulation method is output to modulation section 701b.

On the other hand, if the RSSI signal level is less than threshold value α, control section 702 estimates that channel quality has fallen, and outputs a control signal setting the QPSK modulation method as the systematic bit data modulation method to modulation section 701a. Similarly, if the RSSI signal level is less than threshold value β, control section 702 estimates that channel quality has fallen, and outputs a control signal setting the QPSK modulation method as the parity bit data modulation method to modulation section 701b. If communication is currently in progress and the modulation method currently being used continues to be used as a result of the determination by control section 702, control section 702 does not output control signals to modulation section 701a and modulation section 701b. The configuration of control section 702 will be described in detail later herein.

Based on a control signal input from control section 702, modulation section 701a performs QPSK modulation or 16QAM modulation on systematic bit data input from coding section 101, and outputs the resulting data to subcarrier allocation section 103.

Based on a control signal input from control section 702, modulation section 701b performs QPSK modulation or 16QAM modulation on parity bit data input from coding section 101, and outputs the resulting data to subcarrier allocation section 103.

The configuration of control section 702 will now be described in detail using FIG. 8. Control section 702 is mainly composed of a first determination control section 801 and a second determination control section 802.

If the RSSI signal level is greater than or equal to previously set threshold value α, first determination control section 801 outputs a control signal setting 16QAM as the modulation method to modulation section 701a. If, on the other hand, the RSSI signal level is less than threshold value α (not shown), first determination control section 801 outputs a control signal setting QPSK as the modulation method to modulation section 701a.

If the RSSI signal level is greater than or equal to previously set threshold value β, second determination control section 802 outputs a control signal setting 16QAM as the modulation method to modulation section 701b. If, on the other hand, the RSSI signal level is less than threshold value β (not shown), second determination control section 802 outputs a control signal setting QPSK as the modulation method to modulation section 701b.

As systematic bit data requires better communication quality than parity bit data, threshold value α is set to a higher RSSI signal level than threshold value β.

In modulation sections 701a and 701b, systematic bit data and parity bit data that have been adaptively modulated independently undergo orthogonal frequency division multiplexing in OFDM section 104, after which parity bit data is allocated to subcarriers in the vicinity of both ends, and systematic bit data is allocated to subcarriers in the vicinity of center frequency F1.

Thus, according to a multicarrier transmitting apparatus and multicarrier transmitting method of this embodiment, in addition to the provision of the effects of above-described Embodiment 1, systematic bit data and parity bit data are adaptively modulated according to channel quality, so that by modulating systematic bit data for which good quality is required by means of a modulation method with a small M-ary modulation number, and modulating parity bit data by means of a modulation method with a large M-ary modulation number, it is possible to reduce degradation of parity bit data error rate characteristics even though parity bit data is allocated to subcarriers in the vicinity of both ends. Also, as systematic bit data and parity bit data are adaptively modulated according to channel quality, it is possible to achieve both an improvement in error rate characteristics and an improvement in transmission efficiency. Furthermore, in control section 702, systematic bit data and parity bit data are compared with different threshold values α and β, providing a flexible response to variations in channel quality, and enabling both an improvement in error rate characteristics and an improvement in transmission efficiency to be achieved.

In this embodiment, both systematic bit data and parity bit data are adaptively modulated, but this is not a limitation, and it is also possible to use a fixed modulation method for either systematic bit data or parity bit data, and perform adaptive modulation only for the other. In this embodiment, also, control section 702 compares an RSSI signal level with threshold value α and threshold value β, but this is not a limitation, and it is also possible for a signal, etc., indicating channel quality other than an RSSI signal to be compared with threshold value α and threshold value β. Furthermore, in this embodiment, threshold value α and threshold value β are different values, but this is not a limitation, and threshold value α and threshold value β may be set to the same value, or the value of threshold value α may be made smaller than the value of threshold value β. Moreover, adaptive modulation may be performed by means of a modulation method other than 16QAM or QPSK, such as BPSK. Also, systematic bit data is modulated by modulation section 701a and parity bit data is modulated by modulation section 701b, but this is not a limitation, and systematic bit data and parity bit data may be adaptively modulated independently by a single modulation section. Furthermore, transmit data is not limited to systematic bit data and parity bit data, and may be data other than systematic bit data and parity bit data for which the required quality differs. In this case, a coder other than a turbo coder can be used for coding section 101.

Embodiment 4

Figure 9:
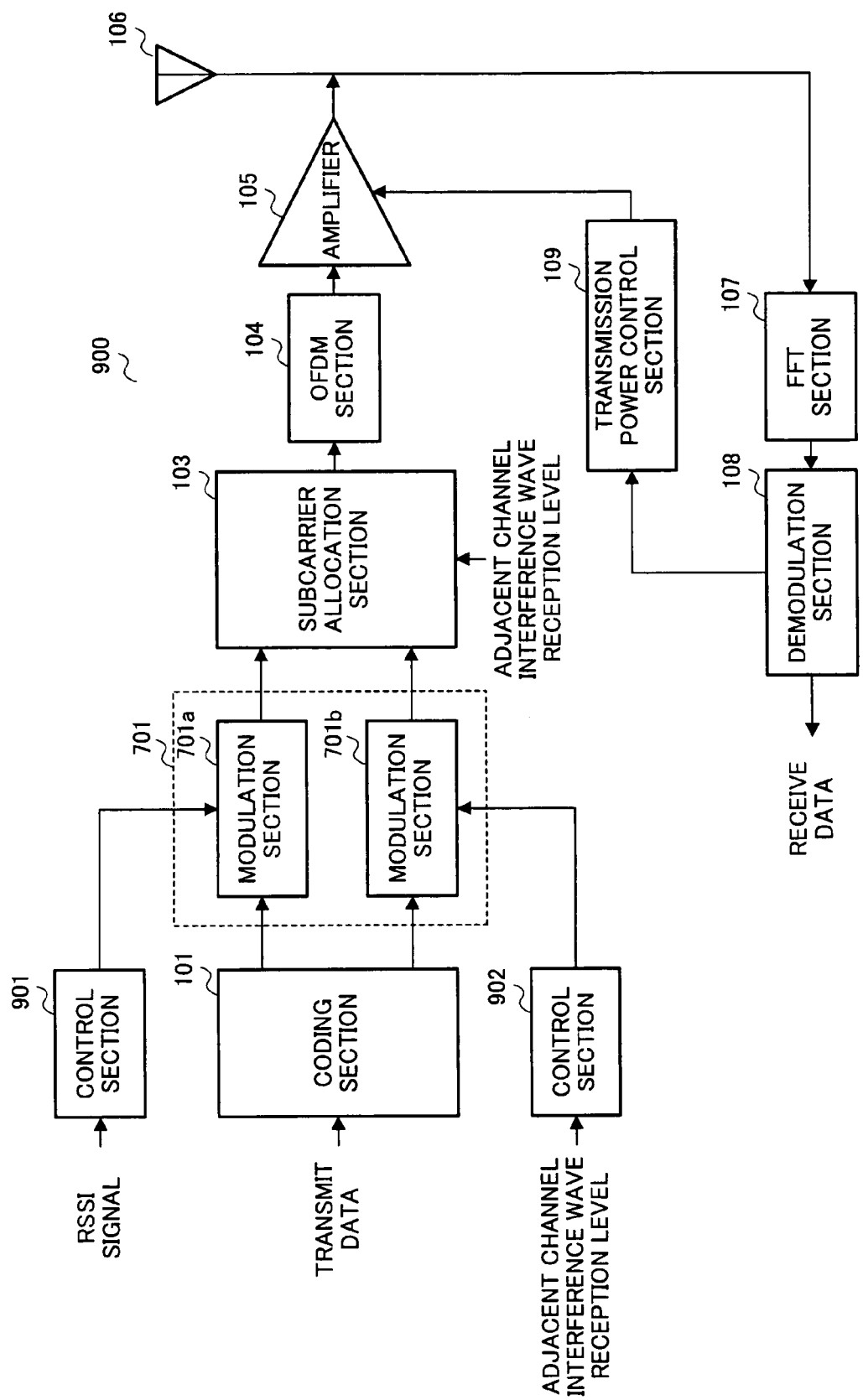
FIG. 9 is a block diagram showing the configuration of a multicarrier transmitting apparatus according to Embodiment 4 of the present invention.

FIG. 9 is a drawing showing the configuration of a multicarrier transmitting apparatus 900 according to Embodiment 4 of the present invention. A feature of this embodiment is that, in addition to turbo code being used as an error correction code, and systematic bit data and parity bit data being adaptively modulated independently, the modulation method is set for parity bit data based on a comparison of the adjacent channel interference wave reception level with a threshold value β.

In this embodiment, the configuration in FIG. 9 differs from that in FIG. 1 in that a modulation section 701 is composed of a modulation section 701a and modulation section 701b, and control sections 901 and 902 are provided. Other component parts in FIG. 9 are identical to those in FIG. 1 and are assigned the same codes as in FIG. 1, and descriptions thereof are omitted. The configurations and operation of modulation section 701a and 701b are the same as in Embodiment 3 above, and therefore descriptions thereof are omitted.

Control section 901 outputs to modulation section 701a a control signal specifying a modulation method set based on an RSSI signal level. That is to say, if the RSSI signal level is greater than or equal to a threshold value α, control section 901 outputs to modulation section 701a a control signal setting the 16QAM modulation method as the systematic bit data modulation method.

If, on the other hand, the RSSI signal level is less than threshold value α, control section 901 outputs to modulation section 701a a control signal setting the QPSK modulation method as the systematic bit data modulation method.

Control section 902 outputs to modulation section 701b a control signal specifying a modulation method set based on the adjacent channel interference wave reception level. That is to say, if the adjacent channel interference wave reception level is greater than or equal to a threshold value β, control section 902 outputs to modulation section 701b a control signal setting the QPSK modulation method as the parity bit data modulation method. Methods for measuring the adjacent channel interference wave reception level include, for example, detecting the level difference before and after an adjacent channel elimination filter of a radio section (not shown) is detected, or switching the frequency to an adjacent channel frequency in a time period in which neither transmission not reception is being performed and measuring the level.

If, on the other hand, the adjacent channel interference wave reception level is less than threshold value β, control section 902 outputs to modulation section 701b a control signal setting the 16 QAM modulation method as the parity bit data modulation method.

Thus, according to a multicarrier transmitting apparatus and multicarrier transmitting method of this embodiment, in addition to the provision of the effects of above-described Embodiment 1 and Embodiment 3, parity bit data is adaptively modulated according to the adjacent channel interference wave reception level, so that when the adjacent channel interference wave reception level is high, parity bit data can be modulated by means of a modulation method with a small M-ary modulation number, making it possible to reduce degradation of parity bit data error rate characteristics even though parity bit data is allocated to subcarriers in the vicinity of both ends.

In this embodiment, both systematic bit data and parity bit data are adaptively modulated, but this is not a limitation, and it is also possible to use a fixed modulation method for either systematic bit data or parity bit data, and perform adaptive modulation only for the other. In this embodiment, also, control section 901 compares an RSSI signal level with threshold value α, but this is not a limitation, and it is also possible for a signal, etc., indicating channel quality other than an RSSI signal to be compared with threshold value α, and, for example, for the adjacent channel interference wave reception level to be compared with threshold value a. Moreover, adaptive modulation may be performed by means of a modulation method other than 16QAM or QPSK. Also, systematic bit data is modulated by modulation section 701a and parity bit data is modulated by modulation section 701b, but this is not a limitation, and systematic bit data and parity bit data may be adaptively modulated independently by a single modulation section.

Furthermore, transmit data is not limited to systematic bit data and parity bit data, and may be data other than systematic bit data and parity bit data for which the required quality differs. In this case, a coder other than a turbo coder can be used for coding section 101.

Embodiment 5

Figure 10:
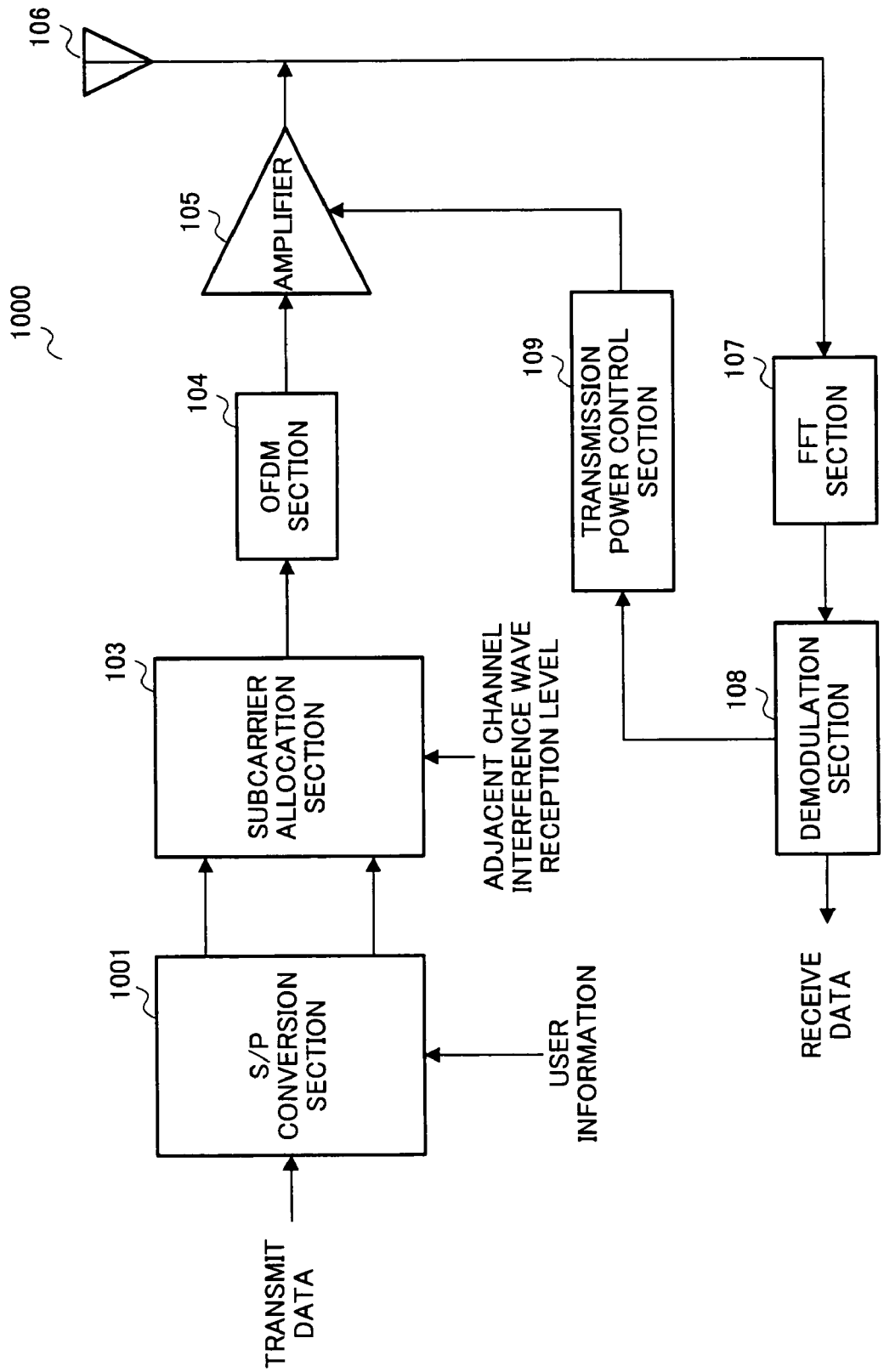
FIG. 10 is a block diagram showing the configuration of a multicarrier transmitting apparatus according to Embodiment 5 of the present invention.

FIG. 10 is a drawing showing the configuration of a multicarrier transmitting apparatus 1000 according to Embodiment 5 of the present invention. The further a user is, comparatively, from a base station, the stronger is the effect of adjacent channel interference waves from many cells, and therefore the greater is the degradation of channel quality. A feature of this embodiment is that data of a user comparatively far from a base station is allocated to subcarriers in the vicinity of the center frequency.

In this embodiment, the configuration in FIG. 10 differs from that in FIG. 1 in the provision of a serial-parallel (hereinafter referred to as "S/P") conversion section 1001. Other component parts in FIG. 10 are identical to those in FIG. 1, and therefore descriptions thereof are omitted.

Based on user information input from a user information storage section (not shown), S/P conversion section 1001 divides transmit data into transmit data to be transmitted to nearby users and transmit data to be transmitted to distant users, and outputs the respective transmit data to subcarrier allocation section 103.

Subcarrier allocation section 103 performs rearrangement of the transmit data so that transmit-data to be transmitted to nearby users is allocated to subcarriers in frequency range W1 in FIG. 3, and transmit data to be transmitted to distant users is allocated to subcarriers in frequency range W2, and outputs the rearranged transmit data to OFDM section 104.

Thus, according to a multicarrier transmitting apparatus and multicarrier transmitting method of this embodiment, transmit data to be transmitted to distant users is allocated to subcarriers in the vicinity of the center frequency, and transmit data to be transmitted to nearby users is allocated to subcarriers in the vicinity of both ends, enabling the channel quality of transmit data of a user comparatively far from a base station to be improved without lowering transmission efficiency. Also, transmission power control is performed so that the transmission power of transmit data to be transmitted to distant users allocated to subcarriers in the vicinity of the center frequency is greater than the transmission power of transmit data to be transmitted to nearby users allocated to subcarriers of the frequencies at both ends, enabling the error rate characteristics of transmit data to be transmitted to distant users to be improved.

According to this embodiment, adaptation is possible to both the case where error correction is performed using a turbo coder and the case where error correction is performed using a coder other than a turbo coder. When error correction is performed using a turbo coder, systematic bit data may be further allocated to subcarriers in the vicinity of the center frequency among subcarriers to which transmit data of users comparatively far from a base station is allocated. Also, in this embodiment, transmit data output from S/P conversion section 1001 is divided into two—transmit data of users near a base station and transmit data of users comparatively far from a base station—but this is not a limitation, and transmit data may be output divided into three or more kinds of transmit data according to the distance of a user, etc.

Embodiment 6

Figure 11:
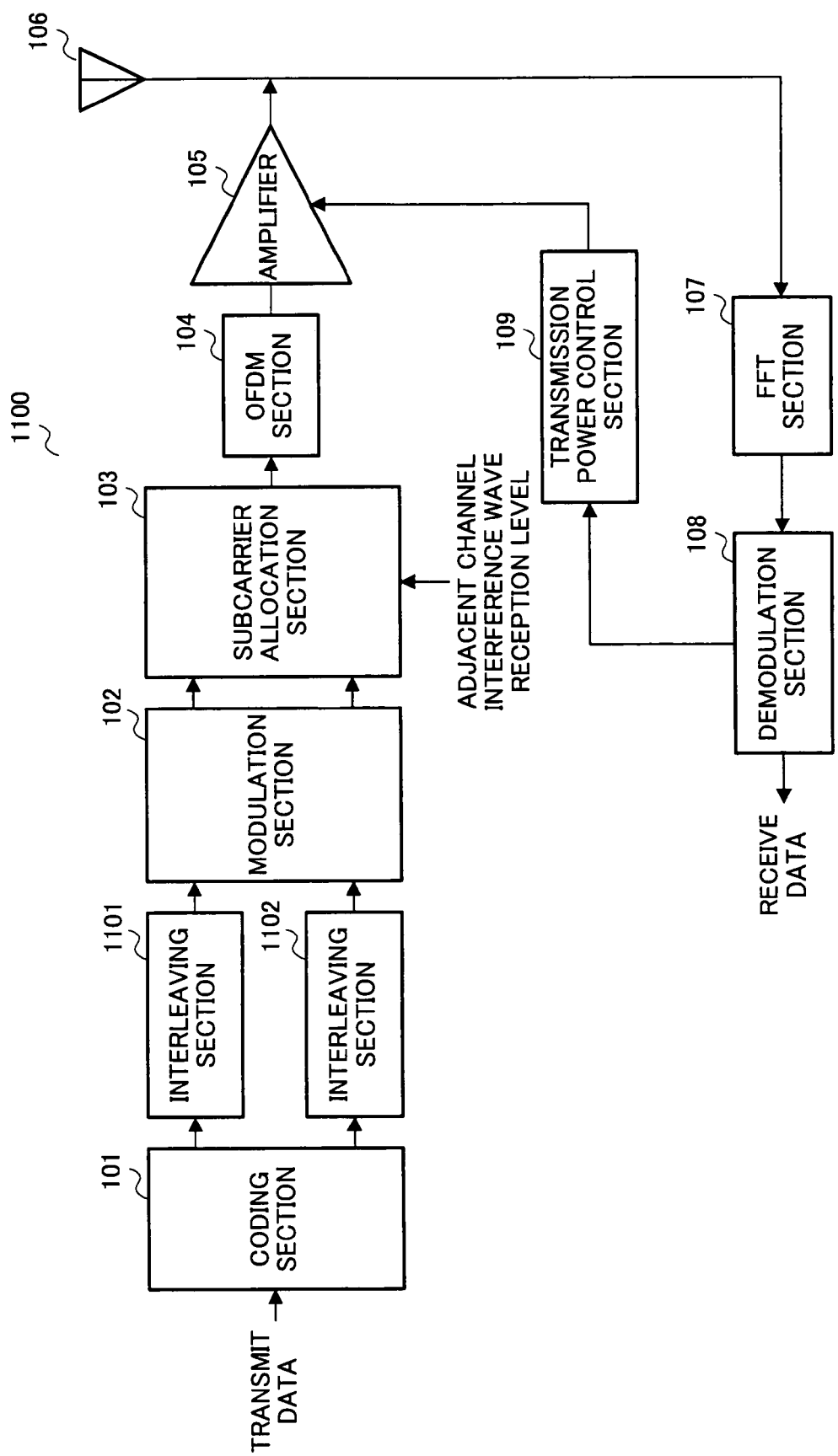
FIG. 11 is a block diagram showing the configuration of a multicarrier transmitting apparatus according to Embodiment 6 of the present invention.

FIG. 11 is a drawing showing the configuration of a multicarrier transmitting apparatus 1100 according to Embodiment 6 of the present invention. A feature of this embodiment is that, after systematic bit data and parity bit data are independently interleaved, rearrangement is performed in order to allocate systematic bit data and parity bit data to respective subcarriers.

With a communication method using conventional multicarrier transmission, interleaving can be performed in the frequency axis direction, and therefore interleaving is performed en bloc for all subcarriers. However, with this kind of conventional method, some data for which better quality is required than for ordinary data is allocated to subcarriers in the vicinity of both ends, and therefore the error rate improvement effect for data for which better quality is required than for ordinary data decreases.

In this embodiment, the configuration in FIG. 11 differs from that in FIG. 1 in the provision of interleaving sections 1101 and 1102. Other component parts in FIG. 11 are identical to those in FIG. 1, and therefore descriptions thereof are omitted.

Interleaving section 1101 interleaves systematic Bit data turbo coded by coding section 101, and outputs the resulting data to modulation section 102.

Interleaving section 1102 interleaves parity bit data turbo coded by coding section 101, and outputs the resulting data to modulation section 102.

Thus, according to a multicarrier transmitting apparatus and multicarrier transmitting method of this embodiment, in addition to the provision of the effects of above-described Embodiment 1, rearrangement of transmit data is performed by subcarrier allocation section 103 after systematic bit data and parity bit data have been independently interleaved, making it possible to prevent systematic bit data from being allocated to subcarriers of the frequencies at both ends by means of interleaving, and so enabling the error rate characteristics of systematic bit data to be improved. Also, as a result of performing interleaving, it is possible for parity bit data to be demodulated correctly even if errors occur successively in parity bit data allocated to subcarriers of the frequencies at both ends, which are susceptible to the effects of adjacent channel interference waves. Furthermore, it is possible for systematic bit data to be demodulated correctly even if errors occur successively in systematic bit data allocated to subcarriers in the vicinity of center frequency F1.

In this embodiment, error correction is performed using a turbo coder, but this is not a limitation, and it is also possible to perform error correction using a coder other than a turbo coder, then divide transmit data into transmit data for which good quality is required and transmit data for which normal quality is sufficient, and independently interleave the transmit data for which good quality is required and the transmit data for which normal quality is sufficient.

Embodiment 7

Figure 12:
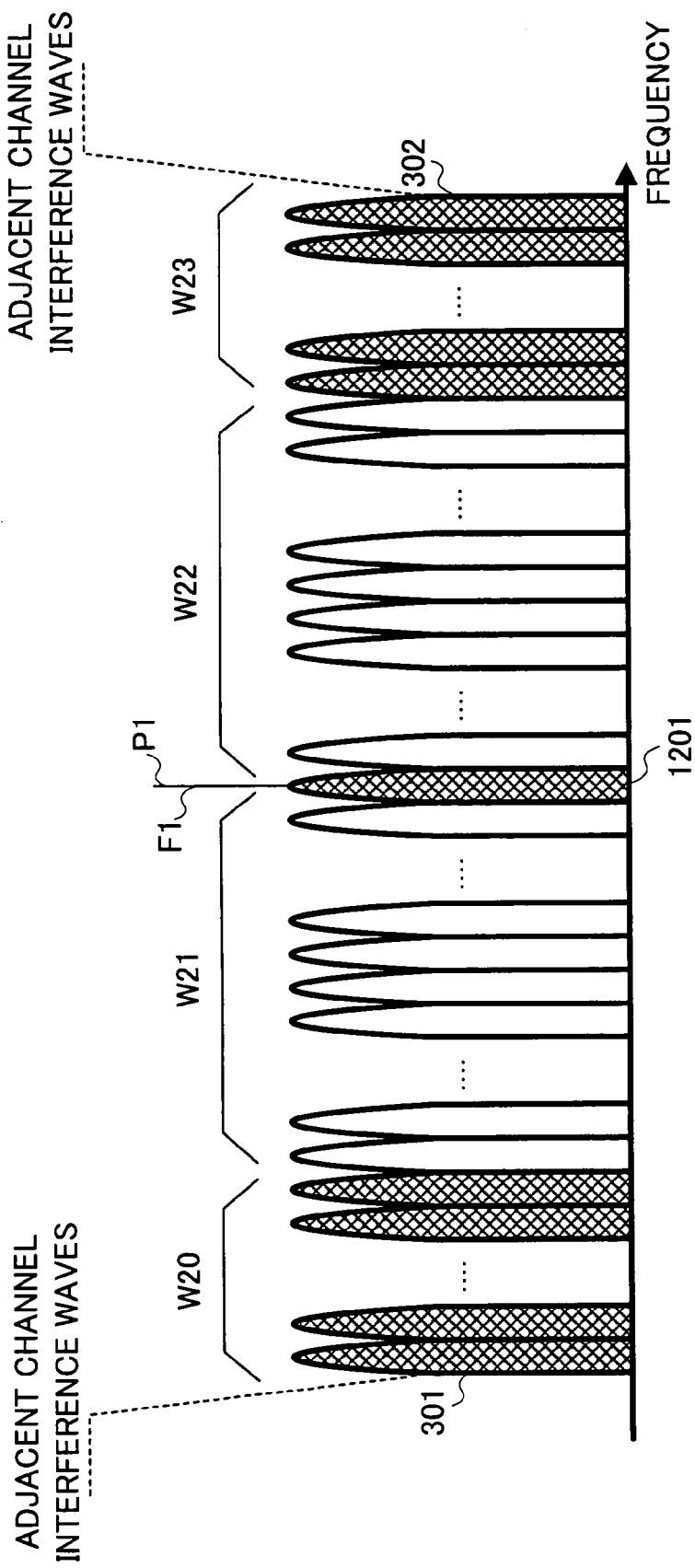
FIG. 12 is a drawing showing data allocation for each subcarrier.

FIG. 12 is a drawing showing transmit data allocation for each subcarrier according to Embodiment 7 of the present invention. Generally, with a radio apparatus using the OFDM-CDMA communication method, DC offset is generated by analog circuitry provided in an amplifier of the radio transmitting section (not shown), and therefore the error rate of a signal transmitted by a subcarrier in the vicinity of the DC point degrades more than the error rate of a signal transmitted by other subcarriers.

Focusing on this point, this embodiment makes provisions so that transmit data for which good quality is required is not allocated to the subcarrier that contains the DC point. The configuration of the multicarrier transmitting apparatus is identical to the configuration in FIG. 1, and therefore a description thereof is omitted.

Subcarrier allocation section 103 performs rearrangement of transmit data so that systematic bit data for which good quality is required is allocated to ranges W21 and W22 in the vicinity of center frequency F1, excluding subcarrier 1201 containing the DC point P1, and parity bit data is allocated to ranges W20 and W23 in the vicinity of both ends and subcarrier 1201 containing DC point P1. Transmit data that has undergone orthogonal frequency division multiplexing by OFDM section 104 is then allocated to subcarriers as shown in FIG. 12.

Subcarrier frequency ranges W21 and W22 to which systematic bit data is allocated are changed according to the adjacent channel interference wave reception level. That is to say, when the adjacent channel interference wave reception level is high, frequency ranges W21 and W22 to which systematic bit data is allocated are made narrower, and when the adjacent channel interference wave reception level is low, frequency ranges W21 and W22 to which systematic bit data is allocated are made wider.

Thus, according to a multicarrier transmitting apparatus and multicarrier transmitting method of this embodiment, in addition to the provision of the effects of above-described Embodiment 1, systematic bit data is not allocated to the center frequency F1 subcarrier, making it possible to prevent degradation of error rate characteristics due to the effects of DC offset.

In this embodiment, it has been assumed that DC point P1 is at the same frequency as center frequency F1, but this embodiment is not limited to the case where DC point P1 is at the same frequency as center frequency F1, and is also applicable to a case where the DC point and center frequency are at different frequencies. Also, in this embodiment, transmit data is not limited to systematic bit data and parity bit data, and may be data other than systematic bit data and parity bit data for which the required quality differs. In this case, a coder other than a turbo coder can be used for coding section 101.

Embodiment 8

Figure 13:
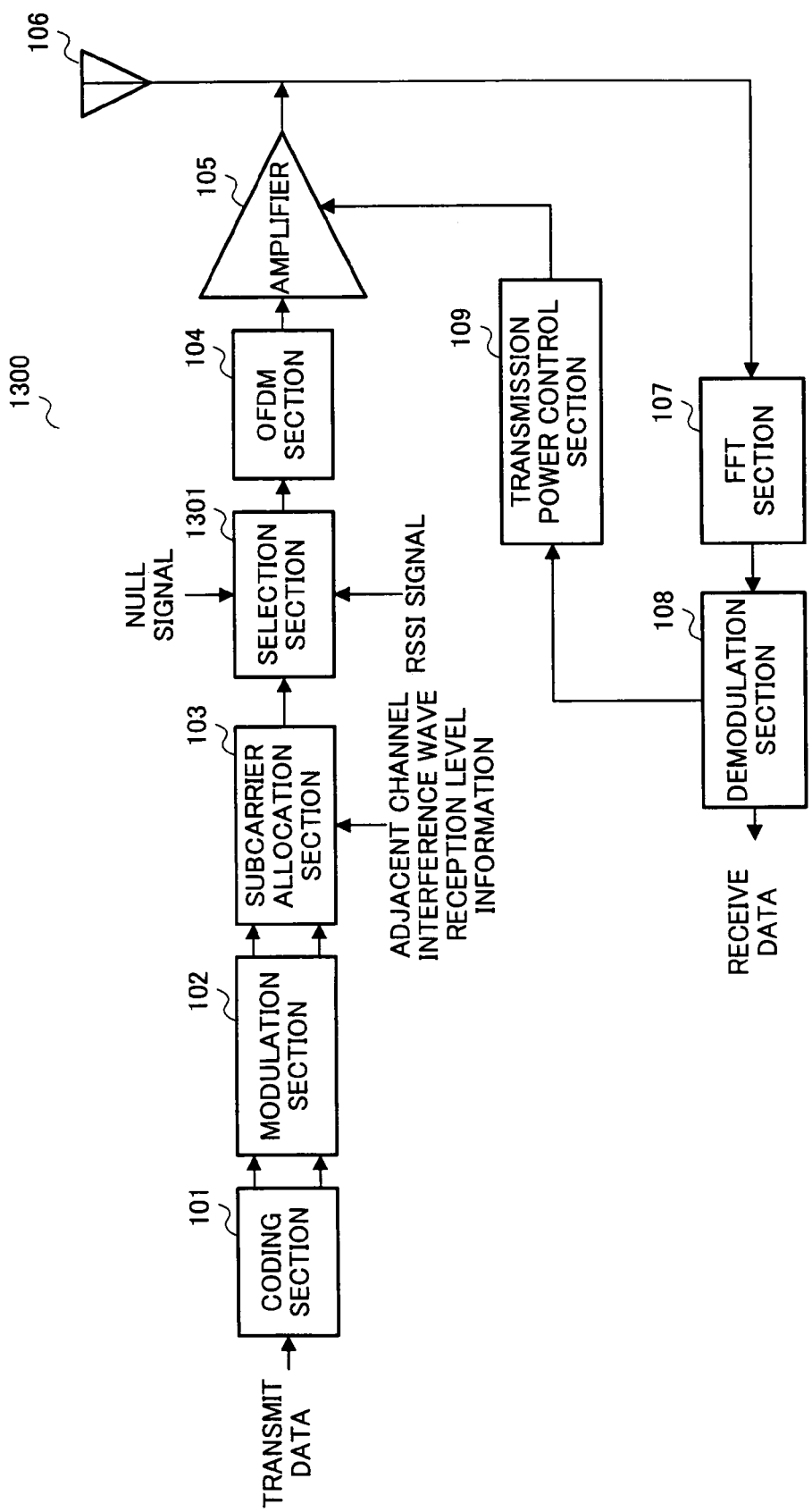
FIG. 13 is a block diagram showing the configuration of a multicarrier transmitting apparatus according to Embodiment 8 of the present invention.

FIG. 13 is a drawing showing the configuration of a multicarrier transmitting apparatus 1300 according to Embodiment 8 of the present invention. A feature of this embodiment is that, in a transmitting apparatus that uses turbo code as an error correction code, adaptively modulates systematic bit data and parity bit data independently, and allocates parity bit data to subcarriers in the vicinity of both ends, provision is made for some of the subcarriers to which parity bit data is allocated not to be transmitted based on an RSSI signal.

In this embodiment, the configuration in FIG. 13 differs from that in FIG. 1 in the provision of a selection section 1301. Component parts in FIG. 13 identical to those in FIG. 1 are assigned the same codes as in FIG. 1, and descriptions thereof are omitted.

From the parity bit data allocated to subcarriers in the vicinity of both ends in the rearranged transmit data input from subcarrier allocation section 103, selection section 1301 selects null signals in place of parity bit data when the timing arrives for input of parity bit data allocated to subcarriers not to be transmitted, and outputs parity bit data including the selected null signals, and systematic bit data, to OFDM section 104.

When selecting parity bit data, based on an input RSSI signal, selection section 1301 makes the number of selected null signals small when channel quality is poor since the number of subcarriers not to be transmitted is made small, and makes the number of selected null signals large when channel quality is good since the number of subcarriers not to be transmitted is made large.

Figure 14:
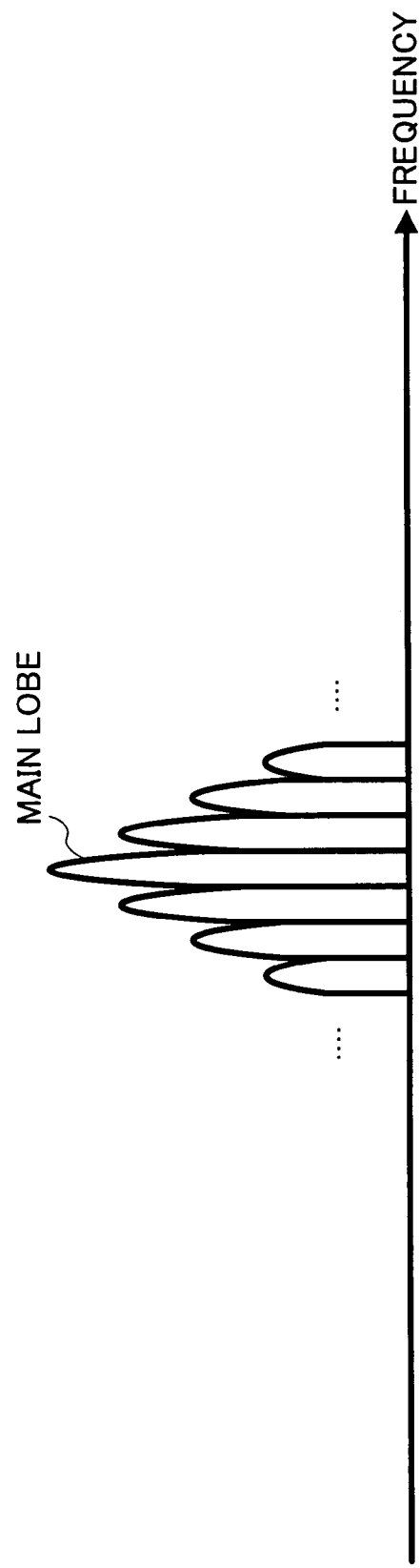
FIG. 14 is a drawing showing a signal spectrum for one subcarrier.
Figure 15:
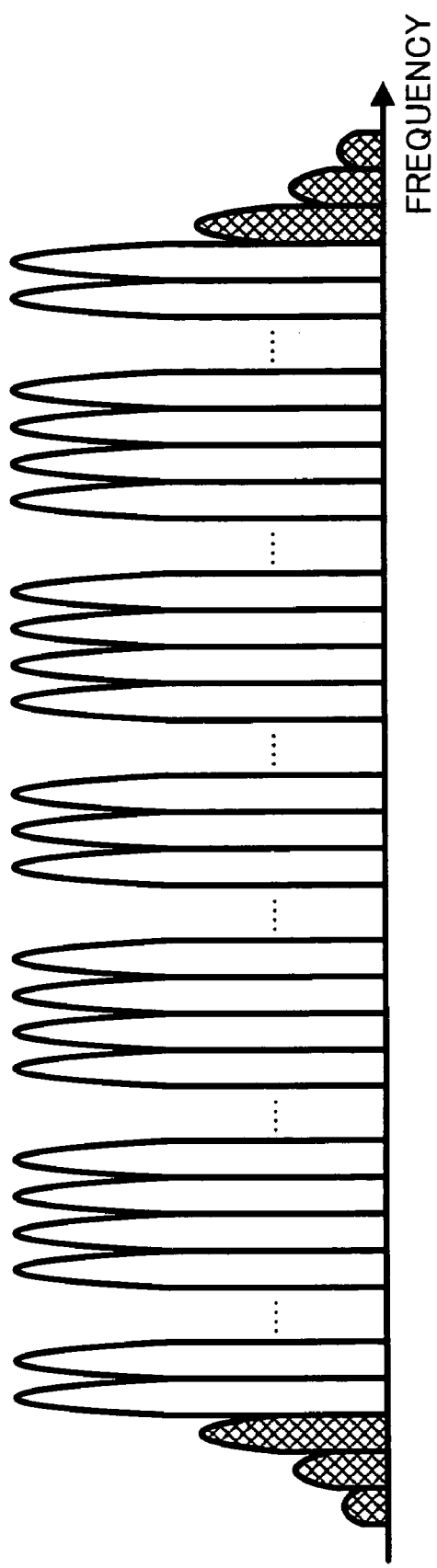
FIG. 15 is a drawing showing a signal spectrum.

With regard to OFDM or MC-CDMA unwanted frequency components, side lobes at both ends are predominant. FIG. 14 shows the signal spectrum for one subcarrier. As shown in FIG. 14, side lobe components are larger the nearer they are to the main lobe. In actuality, there is a sequence of spectra as shown in FIG. 14 corresponding to the number of subcarriers as shown in FIG. 15, and therefore unwanted frequency components—that is, side lobe components—of subcarriers at both ends are predominant. Thus, by allocating parity bit data to subcarriers in the vicinity of both ends and not transmitting a number of subcarriers to which parity bit data has been allocated, it is also possible to further reduce side lobe components. It is therefore also possible to further reduce unwanted frequency components.

Figure 16:
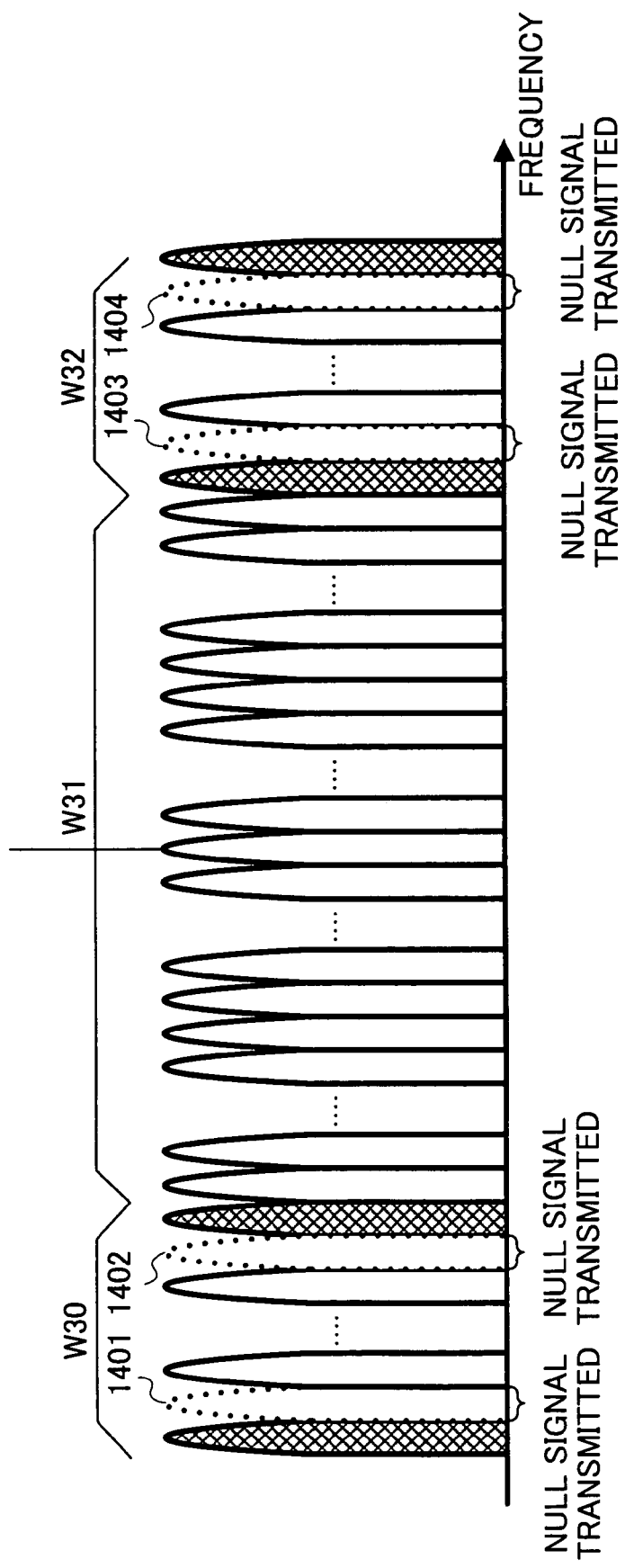
FIG. 16 is a schematic diagram showing data allocation for each subcarrier.

After transmit data has undergone orthogonal frequency division multiplexing processing by OFDM section 104, parity bit data is allocated to frequency ranges W30 and W32, and systematic bit data is allocated to frequency range W31, as shown in FIG. 16. Here, subcarriers 1401, 1402, 1403, and 1404 are subcarriers that are not transmitted, and null signals are transmitted instead of subcarriers 1401, 1402, 1403, and 1404.

With a multicarrier communication method such as OFDM or MC-CDMA, there is a problem of degradation of error rate characteristics when a number of subcarriers are not transmitted as a way of reducing peak power. When turbo code is used as an error correction code, better quality is required for systematic bit data than for parity bit data. Therefore, by not transmitting subcarriers to which parity bit data is allocated, it is possible to achieve compatibility between error rate characteristics and a decrease in peak power.

Thus, according to a multicarrier transmitting apparatus and multicarrier transmitting method of this embodiment, in addition to the provision of the effects of above-described Embodiment 1, a certain amount of parity bit data allocated to subcarriers in the vicinity of both ends is not transmitted, and the data not transmitted is parity bit data that does not require such high quality as systematic bit data, so that it is possible to decrease peak power and reduce out-of-band leakage with almost no degradation of the error rate.

In this embodiment, null signal selection is based on an RSSI signal, but this is not a limitation, and null signal selection can be performed using any channel quality information. Also, in this embodiment, the number of subcarriers not transmitted is four, but this is not a limitation, and it is possible for any number of subcarriers not to be transmitted, and also for the subcarriers that are not to be transmitted to be selected arbitrarily.

Embodiment 9

Figure 17:
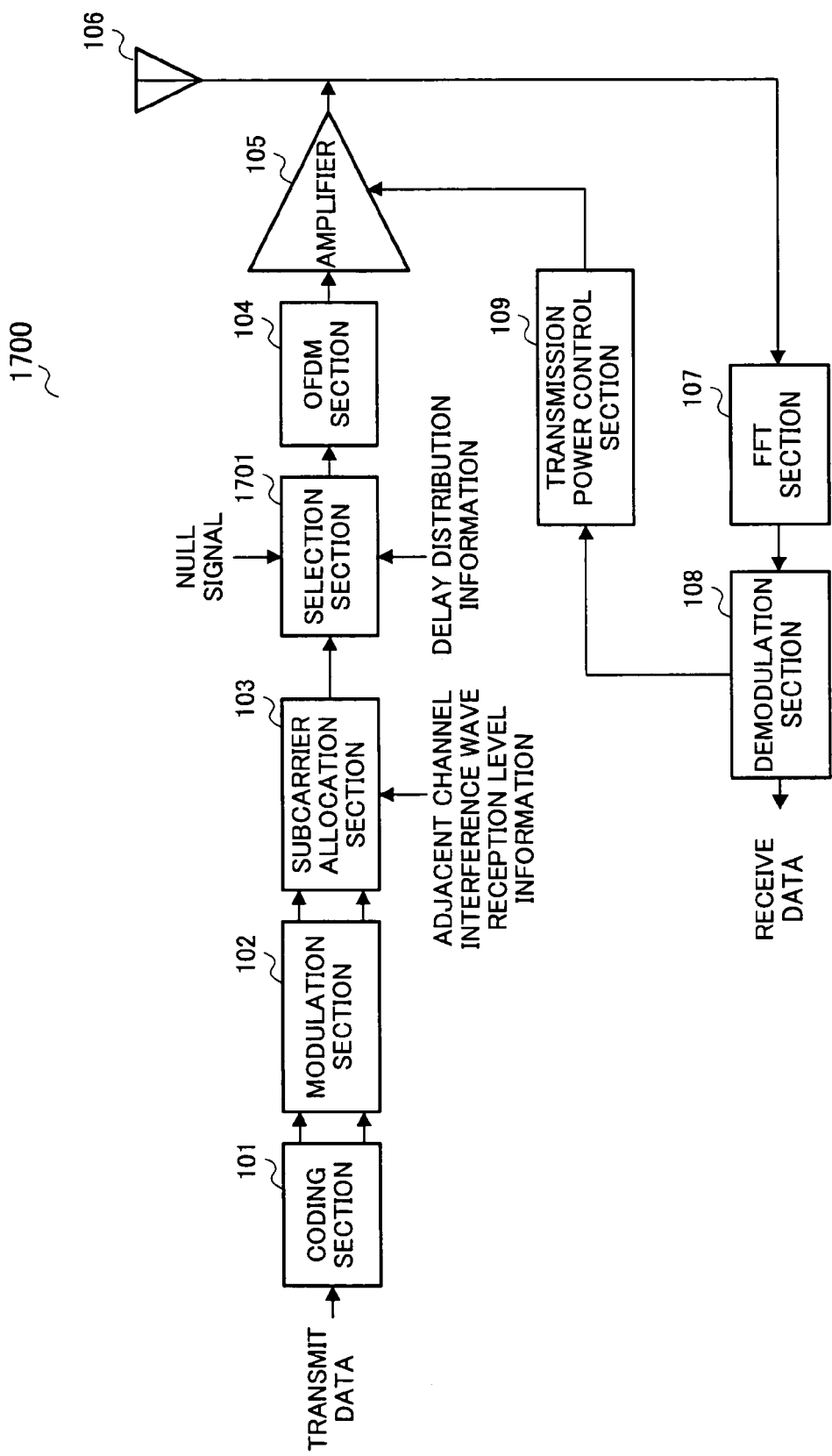
FIG. 17 is a block diagram showing the configuration of a multicarrier transmitting apparatus according to Embodiment 9 of the present invention.

FIG. 17 is a drawing showing the configuration of a multicarrier transmitting apparatus 1700 according to Embodiment 9 of the present invention. A feature of this embodiment is that, in a selection section, provision is made for some of the subcarriers to which parity bit data is allocated not to be transmitted based on delay distribution information.

In this embodiment, the configuration in FIG. 17 differs from that in FIG. 1 in the provision of a selection section 1701. Component parts in FIG. 17 identical to those in FIG. 1 are assigned the same codes as in FIG. 1, and descriptions thereof are omitted.

From the parity bit data allocated to subcarriers in the vicinity of both ends in the rearranged transmit data input from subcarrier allocation section 103, selection section 1701 selects, based on delay distribution information, null signals in place of parity bit data when the timing arrives for input of parity bit data allocated to subcarriers not to be transmitted, and outputs parity bit data including the selected null signals, and systematic bit data, to OFDM section 104.

When selecting parity bit data, based on input delay distribution information, selection section 1701 makes the number of selected null signals small when delay distribution is large since the number of subcarriers not to be transmitted is made small, and makes the number of selected null signals large when delay distribution is small since the number of subcarriers not to be transmitted is made large. Delay distribution information is reported by being included in a transmit signal from a communicating party, and is therefore extracted from a received signal.

Delay distribution information generation section 1800 will now be described using FIG. 18. Delay distribution information generation section 1800 is mainly composed of a delay circuit 1801, subtraction circuit 1802, absolute value generation circuit 1803, and averaging circuit 1804.

Delay circuit 1801 has as input a signal in which the preamble of a received signal has undergone FFT processing, applies delay to the input signal, and outputs the signal to subtraction circuit 1802.

Subtraction circuit 1802 calculates the difference in signal levels of adjacent subcarriers, and outputs the result to absolute value generation circuit 1803.

Absolute value generation circuit 1803 converts the subtraction result input from subtraction circuit 1802 to an absolute value, and outputs this absolute value to averaging circuit 1804.

Averaging circuit 1804 averages absolute values of reception level differences input from absolute value generation circuit 1803 for the number of subcarriers, and delay distribution information is obtained. The delay distribution information obtained in this way is transmitted included in a transmit signal by the communicating party.

Figure 18:
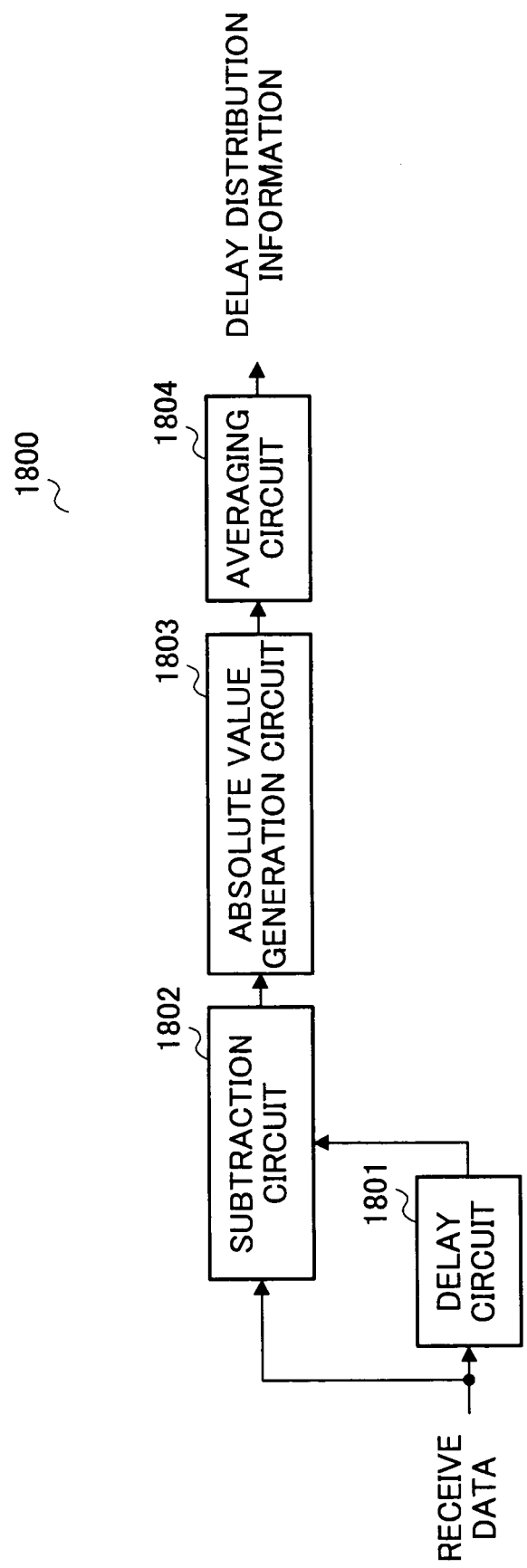
FIG. 18 is a block diagram showing the configuration of a delay distribution information generation section according to Embodiment 9 of the present invention.

Delay distribution information is not limited to the case where it is found by a communicating party and reported by the communicating party, and delay distribution may be detected from a received signal using the circuit in FIG. 18. The case where delay distribution is detected from a received signal is possible with the Time Division Duplex (TDD) communication method or the like. Transmit data allocated to subcarriers after orthogonal frequency division multiplexing processing by OFDM section 104 is identical to that in FIG. 16, and therefore a description thereof is omitted.

Thus, according to a multicarrier transmitting apparatus and multicarrier transmitting method of this embodiment, in addition to the provision of the effects of above-described Embodiment 1, a certain amount of parity bit data allocated to subcarriers in the vicinity of both ends is not transmitted, and the data not transmitted is parity bit data that does not require such high quality as systematic bit data, so that it is possible to decrease peak power and reduce out-of-band leakage with almost no degradation of the error rate. Also, since parity bit data allocated to subcarriers that are transmitted is selected based on delay distribution information, it is possible to prevent an excessive increase in peak power and increased out-of-band leakage or degradation of error rate characteristics due to an inadvertent change of the number of subcarriers not transmitted when it is not necessary to change the number of subcarriers not transmitted as transmit data delay is temporary.

Embodiment 10

Figure 19:
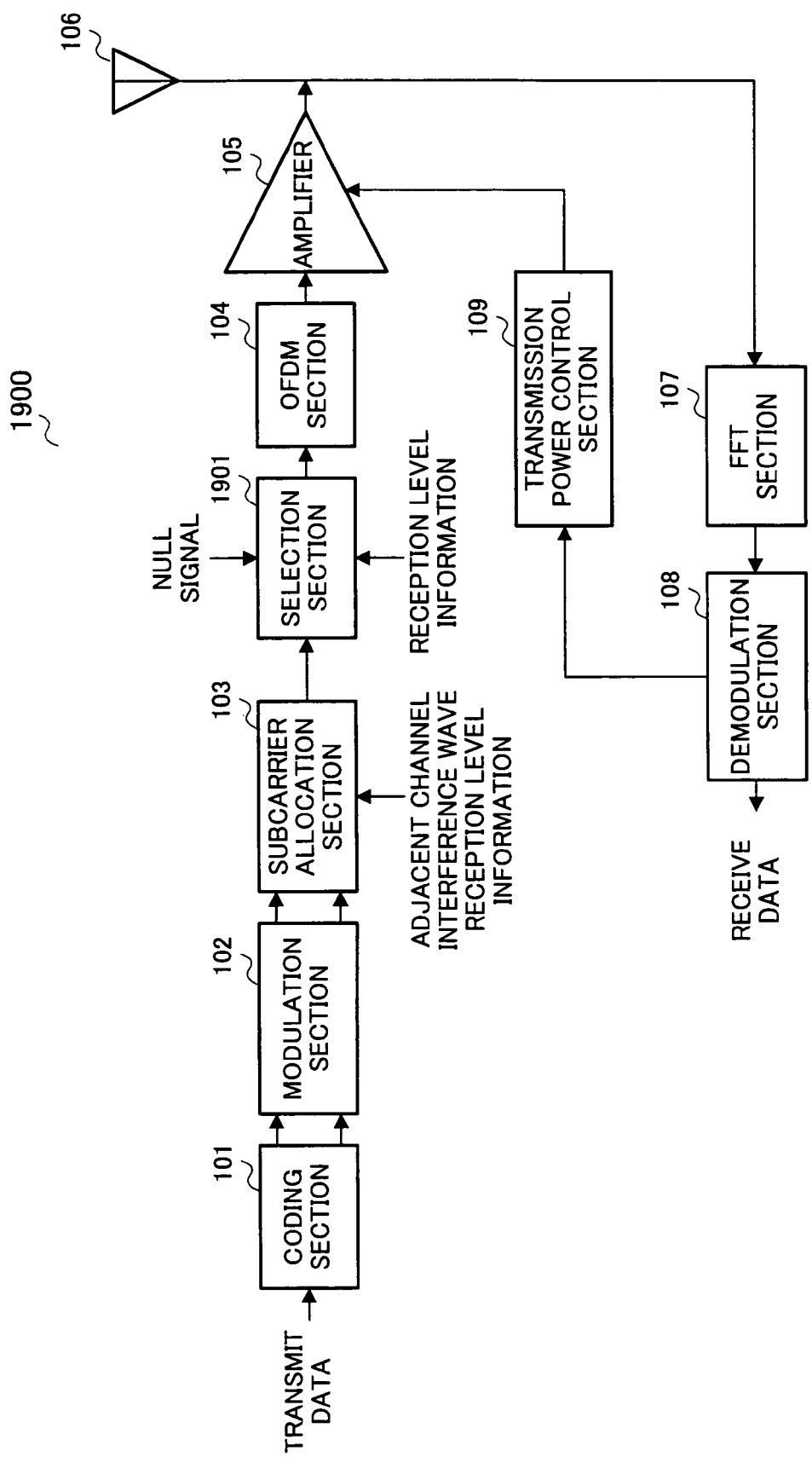
FIG. 19 is a block diagram showing the configuration of a multicarrier transmitting apparatus according to Embodiment 10 of the present invention.

FIG. 19 is a drawing showing the configuration of a multicarrier transmitting apparatus 1900 according to Embodiment 10 of the present invention. A feature of this embodiment is that, in a selection section, provision is made for some of the subcarriers to which parity bit data is allocated not to be transmitted based on reception level information.

In this embodiment, the configuration in FIG. 19 differs from that in FIG. 1 in the provision of a selection section 1901. Component parts in FIG. 19 identical to those in FIG. 1 are assigned the same codes as in FIG. 1, and descriptions thereof are omitted.

When TDD is used as the access method, the propagation path is the same for the uplink and downlink, and therefore there is also a method whereby subcarriers whose reception level has fallen are given priority for non-transmission. By giving priority for non-transmission to subcarriers whose reception level has fallen, it is possible to further achieve both a reduction of error rate characteristic degradation and peak power, and a reduction of unwanted frequency components.

From the parity bit data allocated to subcarriers in the vicinity of both ends in the rearranged transmit data input from subcarrier allocation section 103, selection section 1901 selects, based on reception level information, null signals in place of parity bit data when the timing arrives for input of parity bit data allocated to subcarriers not to be transmitted, and outputs parity bit data including the selected null signals, and systematic bit data, to OFDM section 104.

When selecting parity bit data, based on input reception level information for each subcarrier, selection section 1901 selects null signals in place of parity bit data allocated to subcarriers whose reception level has fallen, and selects systematic bit data and parity bit data including null signals. Any method can be used to determine whether or not the reception level has fallen, such as determination by means of a predetermined threshold value, or relative determination by comparison with the reception levels of other subcarriers. Transmit data allocated to subcarriers after orthogonal frequency division multiplexing processing by OFDM section 104 is identical to that in FIG. 16, and therefore a description thereof is omitted.

Thus, according to a multicarrier transmitting apparatus and multicarrier transmitting method of this embodiment, in addition to the provision of the effects of above-described Embodiment 1, a certain amount of parity bit data allocated to subcarriers in the vicinity of both ends is not transmitted, and the data not transmitted is parity bit data that does not require such high quality as systematic bit data, so that it is possible to decrease peak power and reduce out-of-band leakage with almost no degradation of the error rate. Also, since null signals are selected based on reception level information, parity bit data allocated to subcarriers whose reception level has fallen is not transmitted when transmission is next performed, it is possible to further achieve compatibility between error rate characteristics and a decrease in peak power and reduction of unwanted frequency components.

Embodiment 11

Figure 20:
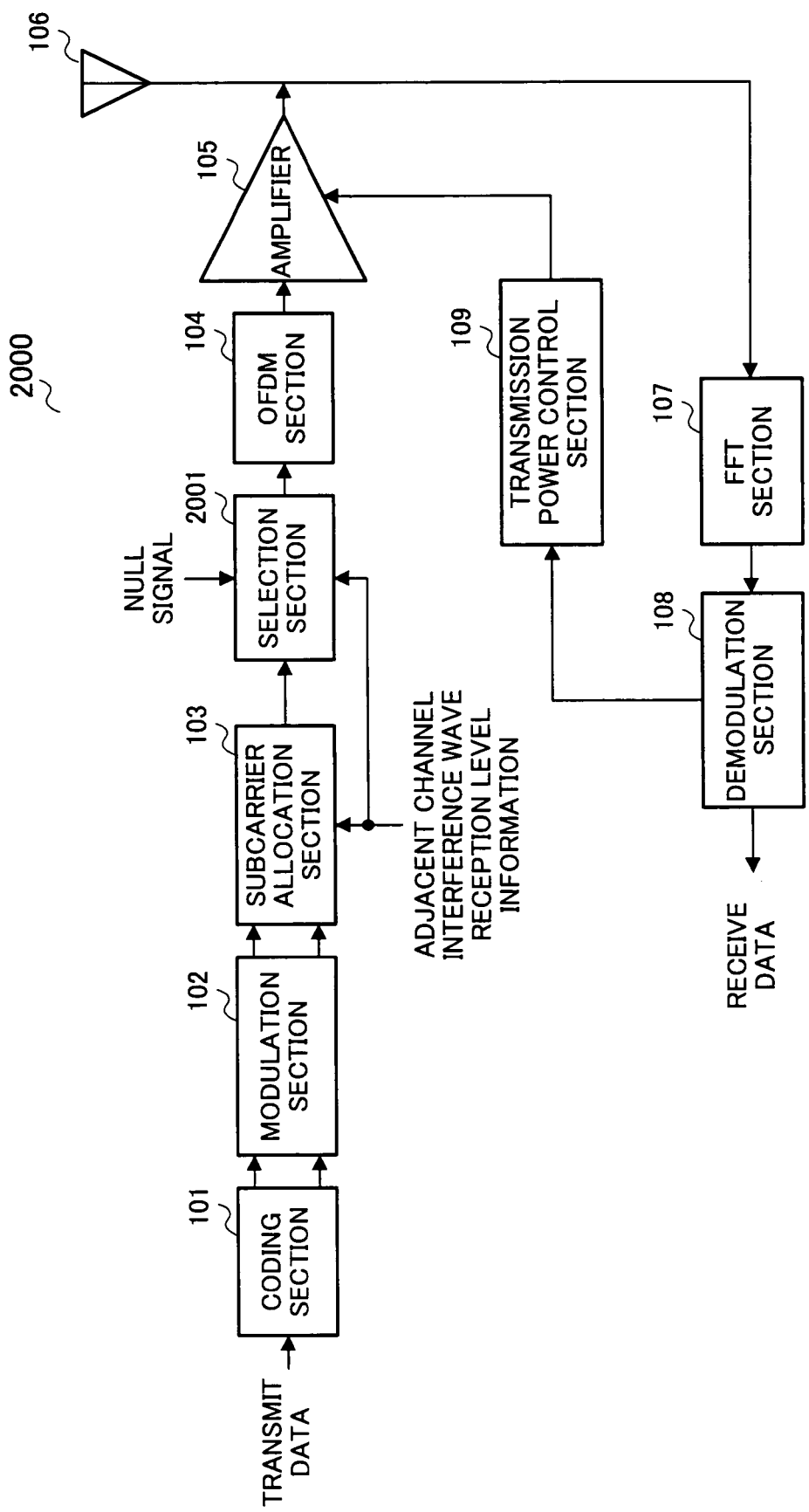
FIG. 20 is a block diagram showing the configuration of a multicarrier transmitting apparatus according to Embodiment 11 of the present invention.

FIG. 20 is a drawing showing the configuration of a multicarrier transmitting apparatus 2000 according to Embodiment 11 of the present invention. A feature of this embodiment is that, in a selection section, provision is made for some of the subcarriers to which parity bit data is allocated not to be transmitted based on adjacent channel interference wave reception level information.

In this embodiment, the configuration in FIG. 20 differs from that in FIG. 1 in the provision of a selection section 2001. Component parts in FIG. 20 identical to those in FIG. 1 are assigned the same codes as in FIG. 1, and descriptions thereof are omitted.

A method whereby the adjacent channel interference wave reception level is also taken into consideration in determining the number of subcarriers not to be transmitted is also effective. The higher the adjacent channel interference wave reception level, the poorer is the quality of subcarriers at both ends. Therefore, with regard to subcarriers at both ends, error rate characteristics may actually be improved by increasing the number of subcarriers not transmitted. Moreover, it goes without saying that peak power and unwanted frequency components are naturally also reduced.

In the rearranged transmit data input from subcarrier allocation section 103, selection section 2001 selects null signals in place of parity bit data allocated to subcarriers at both ends for which the effect of adjacent channel interference wave reception levels is greatest, and outputs systematic bit data, and parity bit data including the selected null signals, to OFDM section 104.

Figure 21:
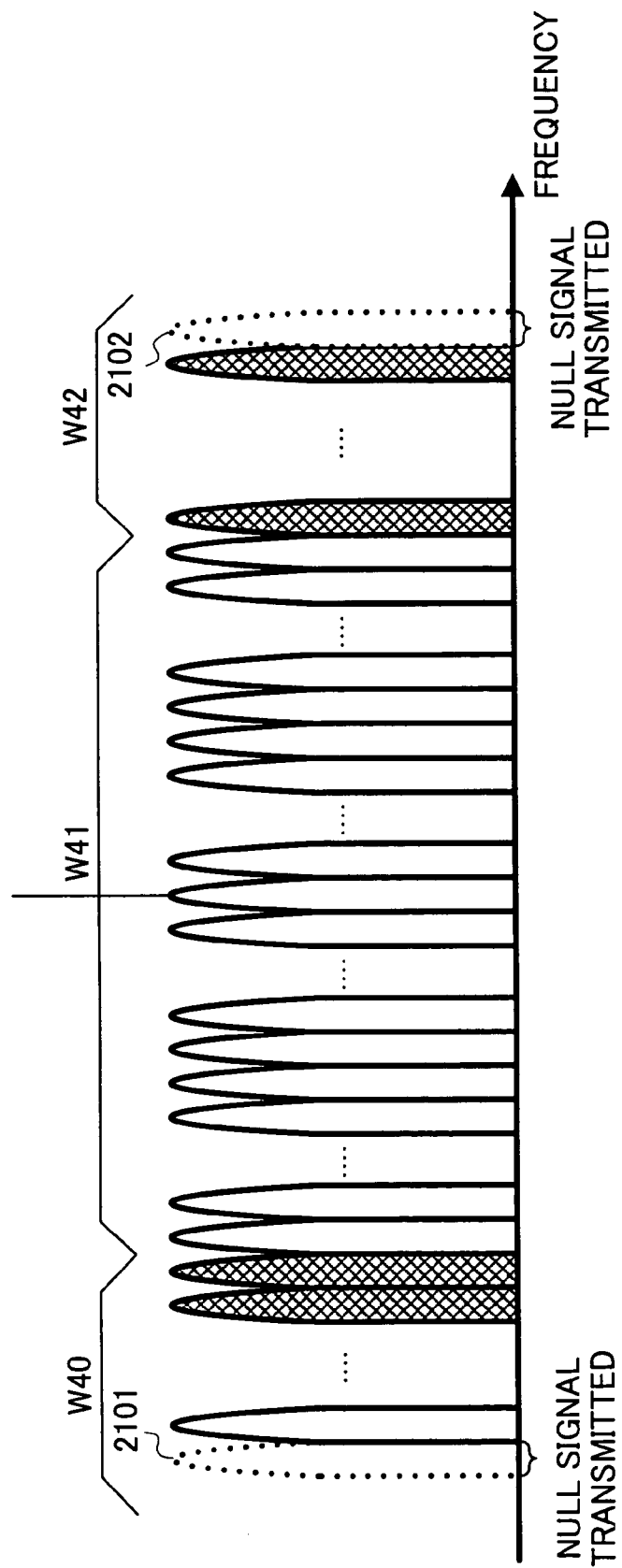
FIG. 21 is a schematic diagram showing data allocation for each subcarrier.

After transmit data has undergone orthogonal frequency division multiplexing processing by OFDM section 104, parity bit data is allocated to frequency ranges W40 and W42, and systematic bit data is allocated to frequency range W41, as shown in FIG. 21. Here, subcarriers 2101 and 2102 at either end are subcarriers that are not transmitted, and null signals are transmitted instead of subcarriers 2101 and 2102.

Thus, according to a multicarrier transmitting apparatus and multicarrier transmitting method of this embodiment, in addition to the provision of the effects of above-described Embodiment 1, a certain amount of parity bit data allocated to subcarriers in the vicinity of both ends is not transmitted, and the data not transmitted is parity bit data that does not require such high quality as systematic bit data, so that it is possible to decrease peak power and reduce out-of-band leakage with almost no degradation of the error rate. Also, since subcarriers at both ends for which the effect of adjacent channel interference wave reception levels is greatest are not transmitted, it is possible to decrease peak power and reduce out-of-band leakage without degrading error rate characteristics.

In this embodiment, the number of subcarriers not transmitted is two, but the number of subcarriers not transmitted is not limited to two, and it is possible for any number of subcarriers toward the center frequency from either end not to be transmitted.

The multicarrier transmitting apparatuses and multicarrier transmitting methods in above-described Embodiment 1 through Embodiment 11 can be applied to a base station apparatus and a communication terminal apparatus.

As described above, according to the present invention, it is possible to improve significantly the error rate characteristics of transmit data for which good quality is required, and prevent degradation of the quality of transmit data for which good quality is required.

This application is based on Japanese Patent Application No. 2002-297534 filed on Oct. 10, 2002, and Japanese Patent Application No. 2003-7616 filed on Jan. 15, 2003, the entire content of which is expressly incorporated by reference herein.

INDUSTRIAL APPLICABILITY

The present invention is applicable to a multicarrier transmitting apparatus and multicarrier transmitting method.

The invention claimed:

1. A multicarrier transmitting apparatus comprising:
a dividing section that divides transmit data into high-quality transmit data requiring good quality and ordinary transmit data other than said high-quality transmit data;
a subcarrier allocation section that rearranges said high-quality transmit data and said ordinary transmit data such that said high-quality transmit data is allocated to subcarriers in a vicinity of a center frequency in a pre-determined frequency domain and said ordinary transmit data is allocated to subcarriers in a vicinity of both ends in the predetermined frequency domain, and that varies in accordance with channel quality a range of subcarriers to which said high-quality transmit data is allocated and a range of subcarriers to which said ordinary transmit data is allocated; and
an orthogonal frequency division multiplexing section that performs orthogonal frequency division multiplexing of said high-quality transmit data and said ordinary transmit data rearranged by said subcarrier allocating section.

2. The multicarrier transmitting apparatus according to claim 1, further comprising a selection section that selects a null signal instead of part of said ordinary transmit data rearranged by said subcarrier allocation section,
wherein said orthogonal frequency division multiplexing section performs orthogonal frequency division multiplexing of said ordinary transmit data comprising the null signal selected by said selection section and said high-quality transmit data.

3. The multicarrier transmitting apparatus according to claim 1, further comprising a spreading section that independently sets numbers of spreading codes assigned to said high-quality transmit data and said ordinary transmit data rearranged by said subcarrier allocation section and that performs spreading processing of said transmit data,
wherein said orthogonal frequency division multiplexing section performs orthogonal frequency division multiplexing of said high-quality transmit data and said ordinary transmit data after the spreading processing in said spreading section, and allocates to subcarriers said high-quality transmit data and said ordinary transmit data after orthogonal frequency division multiplexing.

4. The subcarrier transmitting apparatus according to claim 1, further comprising a spreading section that makes a number of spreading codes assigned to said high-quality transmit data greater than a number of spreading codes assigned to said ordinary transmit data, and performs spreading processing of said high-quality transmit data and said ordinary transmit data,
wherein said orthogonal frequency division multiplexing section performs orthogonal frequency division multiplexing of said high-quality transmit data and said ordinary transmit data after the spreading processing in said spreading section, and allocates to subcarriers said high-quality transmit data and said ordinary transmit data after orthogonal frequency division multiplexing.

5. The multicarrier transmitting apparatus according to claim 1, further comprising a modulation section that modulates said high-quality transmit data and said ordinary transmit data in accordance with the channel quality using independently set modulation methods,
wherein said subcarrier allocation section rearranges said high-quality transmit data and said ordinary transmit data such that said high-quality transmit data modulated in said modulation section is allocated to the subcarriers in a vicinity of the center frequency and said ordinary transmit data modulated in said modulation section is allocated to the subcarriers in the vicinity of both ends.

6. The multicarrier transmitting apparatus according to claim 1, wherein said high-quality transmit data comprises one of information used for communication control and retransmission information.

7. A base station apparatus comprising a multicarrier transmitting apparatus according to claim 1.

8. A communication terminal station apparatus comprising a multicarrier transmitting apparatus according to claim 1.

9. A multicarrier transmitting method comprising the steps of:
in a multicarrier transmitting apparatus, dividing transmit data into high-quality transmit data requiring good quality and ordinary transmit data other than said high-quality transmit data;
in said multicarrier transmitting apparatus, rearranging said high-quality transmit data and said ordinary transmit data such that said high-quality transmit data is allocated to subcarriers in a vicinity of a center frequency in a predetermined frequency domain and said ordinary transmit data is allocated to subcarriers in a vicinity of both ends in the predetermined frequency domain, and varying in accordance with channel quality a range of subcarriers to which said high-quality transmit data is allocated and a range of subcarriers to which said ordinary transmit data is allocated; and
in said multicarrier transmitting apparatus, performing orthogonal frequency division multiplexing of said rearranged high-quality transmit data and said ordinary transmit data.

* * * * *